United States Patent
Okamoto

(10) Patent No.: US 6,920,280 B2
(45) Date of Patent: Jul. 19, 2005

(54) DIGITAL DATA PLAY BACK APPARATUS AND METHOD FOR PLAYING BACK DIGITAL DATA

(75) Inventor: Yutaka Okamoto, Chofu (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 927 days.

(21) Appl. No.: 09/811,449

(22) Filed: Mar. 20, 2001

(65) Prior Publication Data

US 2002/0114616 A1 Aug. 22, 2002

(30) Foreign Application Priority Data

Dec. 19, 2000 (JP) ............................... 2000-385342

(51) Int. Cl.[7] .............................................. H04N 5/911
(52) U.S. Cl. ..................... 386/113; 386/46; 386/126; 360/65
(58) Field of Search .......................... 386/46, 13, 113, 386/126, 85, 100; 375/290, 253, 232

(56) References Cited

U.S. PATENT DOCUMENTS

| | | | | |
|---|---|---|---|---|
| 4,393,413 A | * | 7/1983 | Kaneko | 386/13 |
| 4,644,564 A | * | 2/1987 | Dolivo et al. | 360/46 |
| 4,890,299 A | * | 12/1989 | Dolivo et al. | 375/290 |
| 6,335,949 B1 | * | 1/2002 | Kim | 375/232 |
| 6,738,935 B1 | * | 5/2004 | Kimmitt | 375/253 |

FOREIGN PATENT DOCUMENTS

| | | |
|---|---|---|
| JP | 1-143447 | 6/1989 |
| JP | 6-84290 | 3/1994 |
| JP | 8-46606 | 2/1996 |
| JP | 11-297001 | 10/1999 |
| JP | 11-339401 | 12/1999 |
| JP | 2000-21096 | 1/2000 |
| JP | 200-195191 | 7/2000 |

* cited by examiner

Primary Examiner—Thai Tran
Assistant Examiner—Chrisopher Onuaku
(74) Attorney, Agent, or Firm—Oblon, Spivak, McClelland, Maier & Neustadt, P.C.

(57) ABSTRACT

The present invention relates to a digital data play back apparatus for converting a digital data a signal read from a recording medium by sampling in a clock cycle, equalizing this digital data to a waveform which agrees with a partial response class on the basis of the clock, and detecting data on the basis of the clock with respect to the equalized signal waveform. Then, this apparatus detects a timing phase gradient between the equalized signal waveform and the clock, and controls a clock frequency on the basis of the detected timing phase gradient.

14 Claims, 24 Drawing Sheets

FIG. 1A  RLL CODE  ·····1 0 0 1 0 0 0 1 0 0 0 0 1 0 0 1
FIG. 1B  WRITING SIGNAL 
FIG. 1C  MARK 
FIG. 1D  PLAY BACK SIGNAL 
FIG. 1E  DIFFERENTIAL WAVEFORM 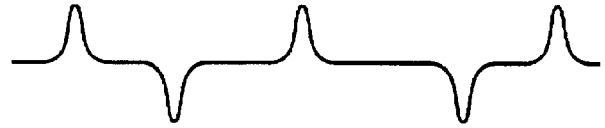
FIG. 1F  DETECTION WINDOW 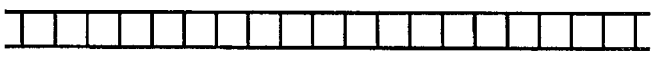
FIG. 1G  CHANNEL CLOCK 
FIG. 1H  DETECTION DATA  1 0 0 1 0 0 0 1 0 0 0 0 1 0 0 1
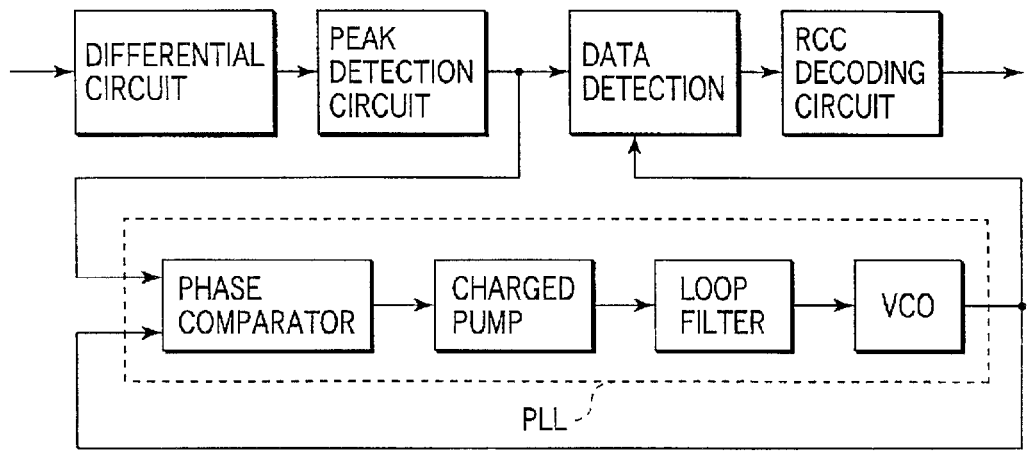
FIG. 2

FIG. 3A  RLL CODE      ·····1 0 0 1 0 0 0 1 0 0 0 0 1 0 0 1 0 ·····
FIG. 3B  WRITING SIGNAL   
FIG. 3C  WRITING BIT ROW    0 0 1 1 1 0 0 0 0 1 1 1 1 1 0 0 0 1 1
FIG. 3D  RESPONSE WAVEFORM   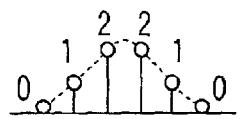
FIG. 3E  SUPER-POSITION OF THE RESPONSE WAVEFORM
```
          0 0 1 2 2 1         1 2 2 1           1 2 2 1
                1 2 2 1         1 2 2 1             1 2 2 1
                  1 2 2 1         1 2 2 1
                        0         1 2 2 1
                                    1 2 2 1
          ─────────────────────────────────────────────
          0 0 1 3 5 5 3 1 0 1 3 5 6 6 5 3 1 1 3 ·····
```
FIG. 3F  PLAY BACK WAVEFORM   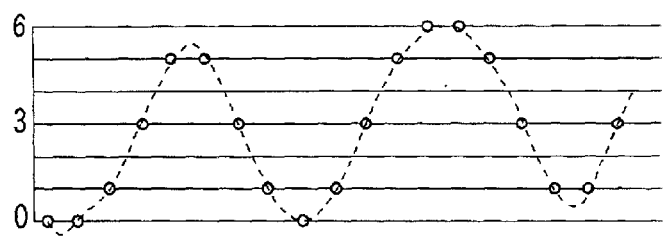

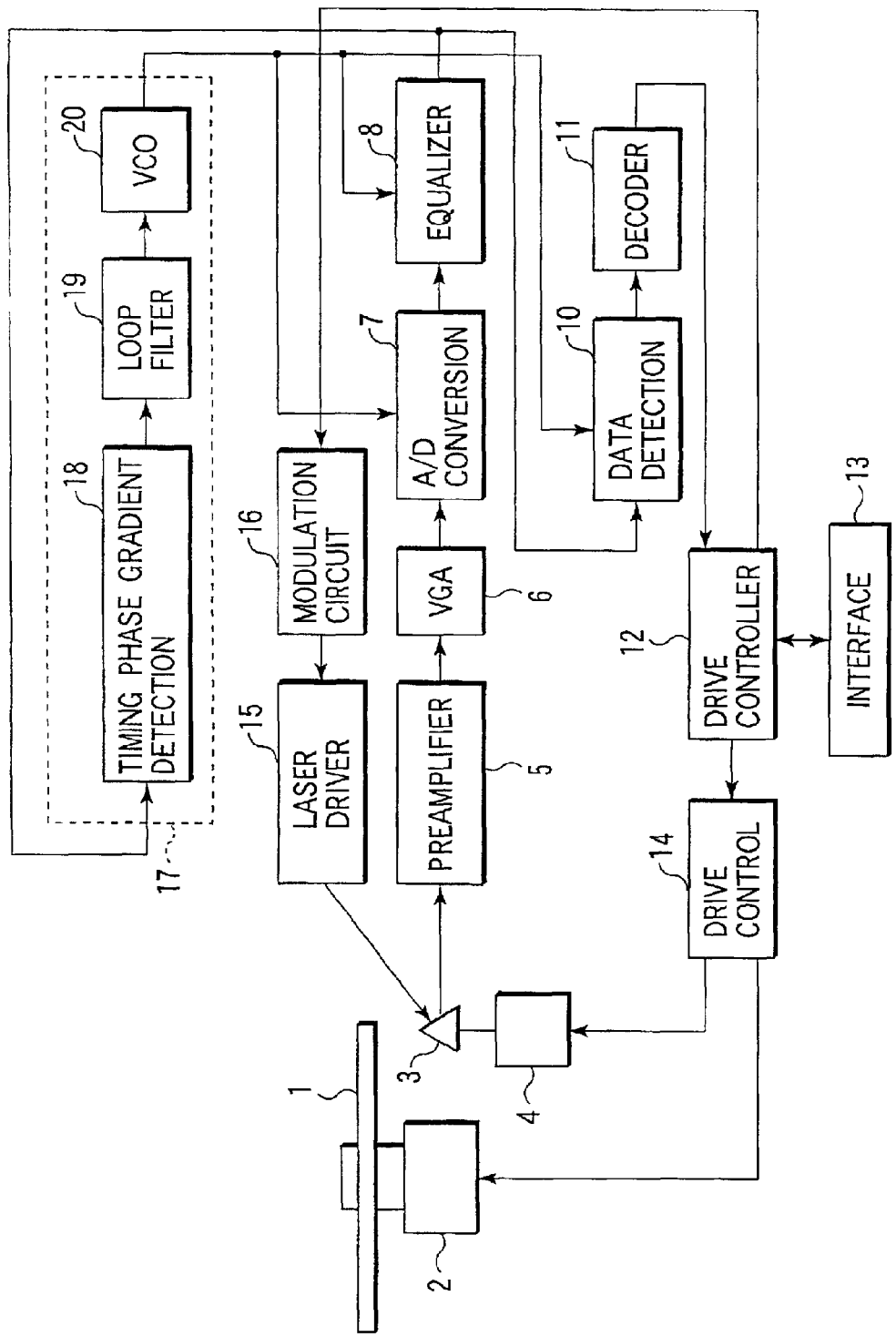
F I G. 4

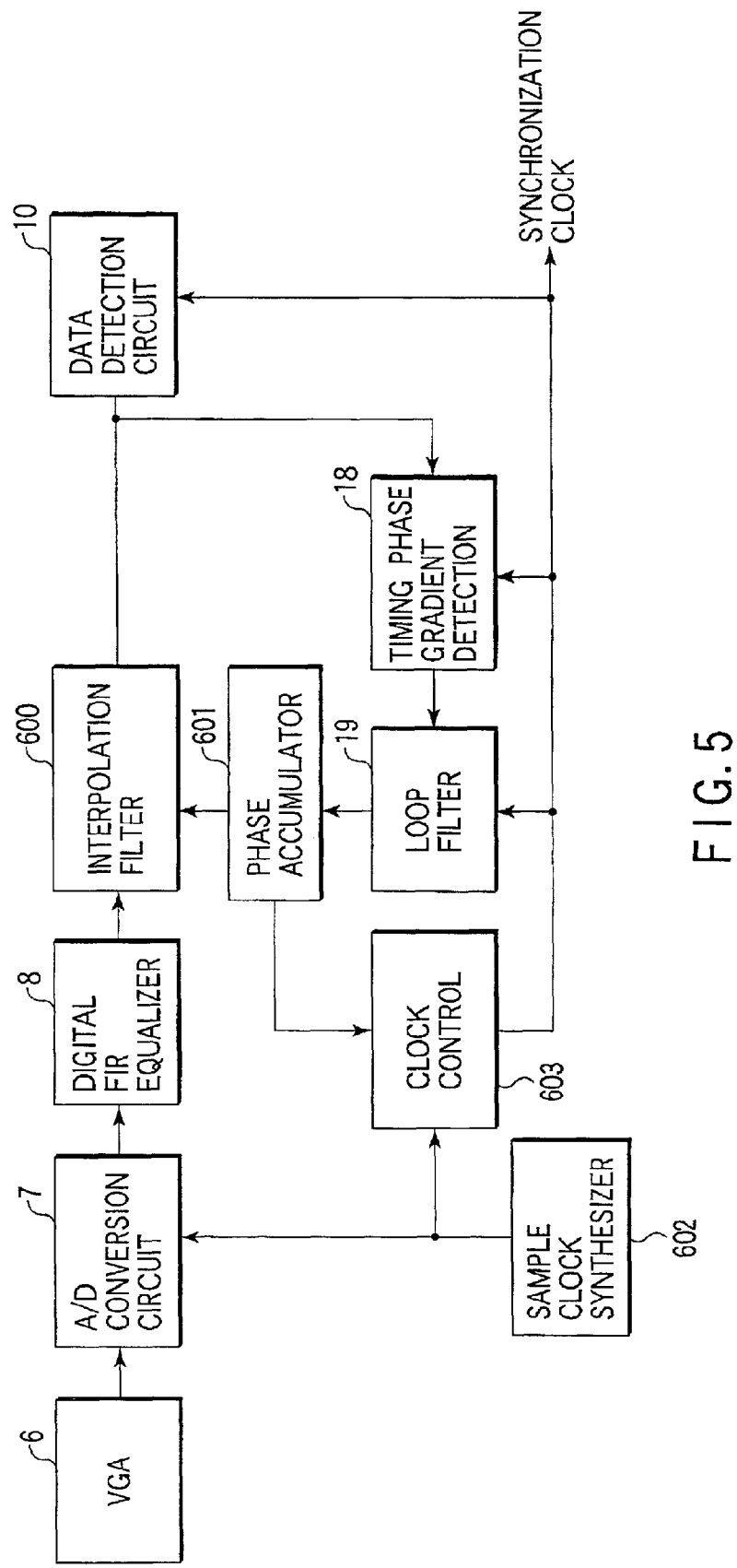
F I G. 5

FIG. 7A  RLL CODE      ·····1 0 0 1 0 0 1 0 0 1 0 0 1 0 0 1 0 0·····
FIG. 7B  WRITING SIGNAL    
FIG. 7C  WRITING BIT ROW    1 1 1 0 0 0 1 1 1 0 0 0 1 1 1 0 0
FIG. 7D  RESPONSE WAVEFORM     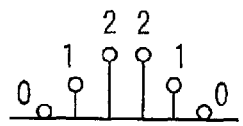
FIG. 7E  {SUPER-POSITION OF THE RESPONSE WAVEFORM}
```
          0 0 1 2 2 1       1 2 2 1       1 2 2 1
                1 2 2 1       1 2 2 1       1 2 2 1
                    1 2 2 1       1 2 2 1       1 2 2 1
          ─────────────────────────────────────────────
          0 0 1 3 5 5 3 1 1 3 5 5 3 1 1 3 5 5 3 1
```
FIG. 7F  PLAY BACK WAVEFORM

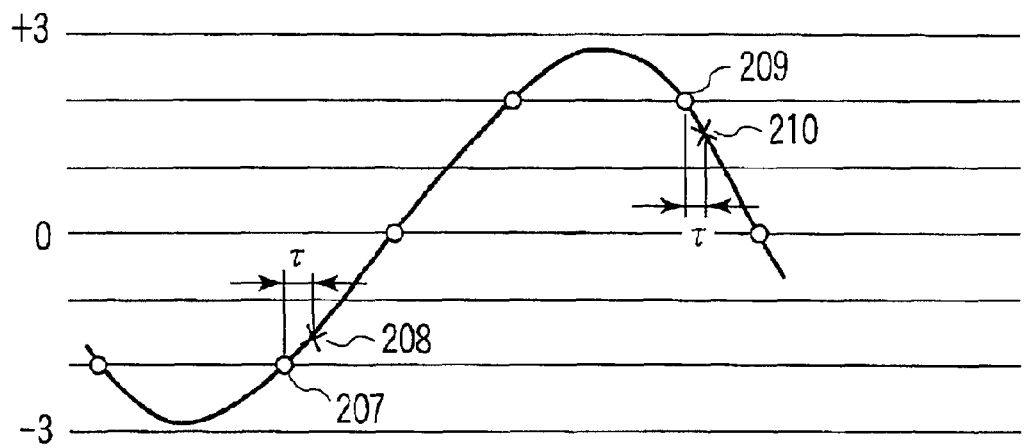
F I G. 9A
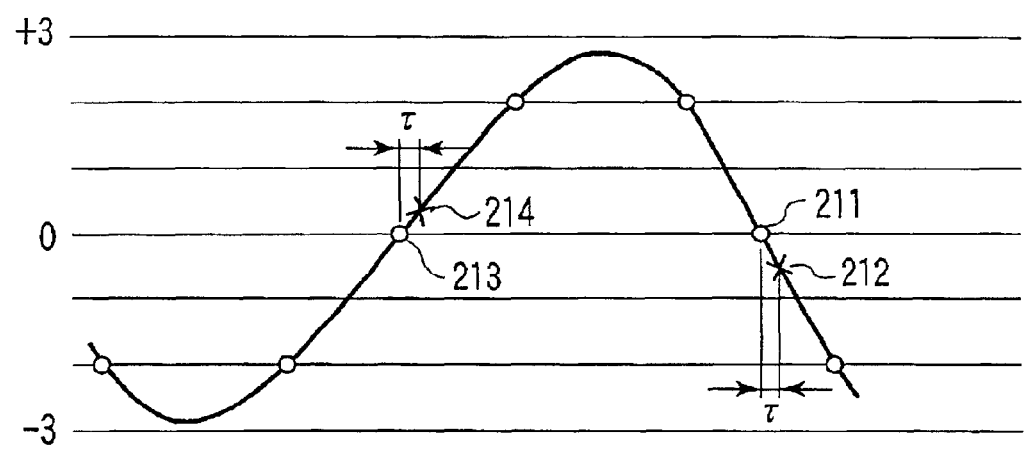
F I G. 9B

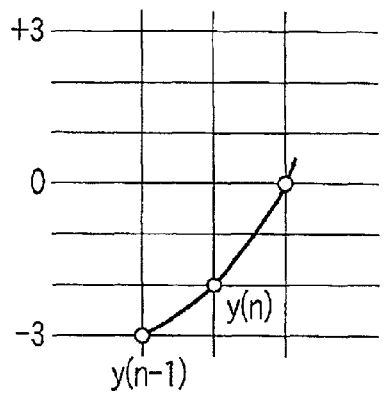
F I G. 19A
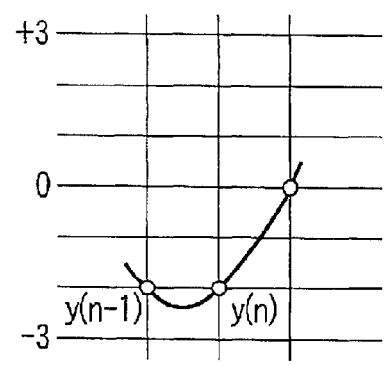
F I G. 19B
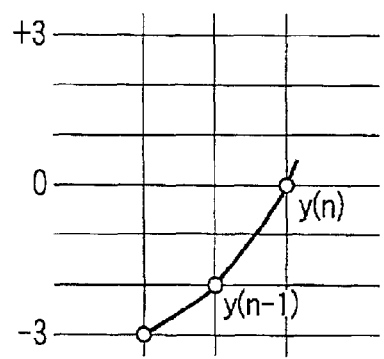
F I G. 19C
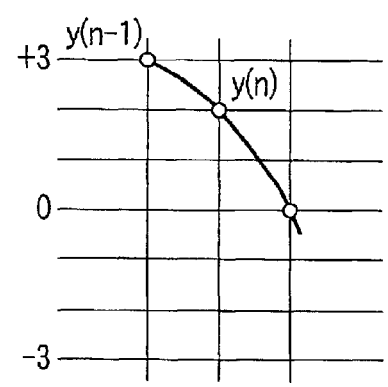
F I G. 19D
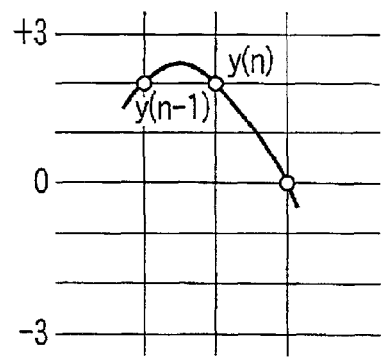
F I G. 19E
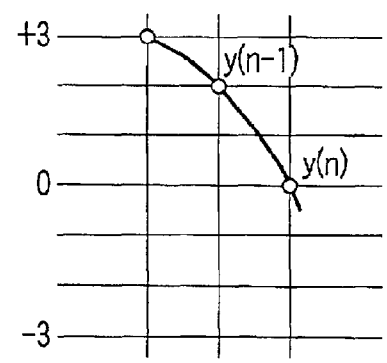
F I G. 19F

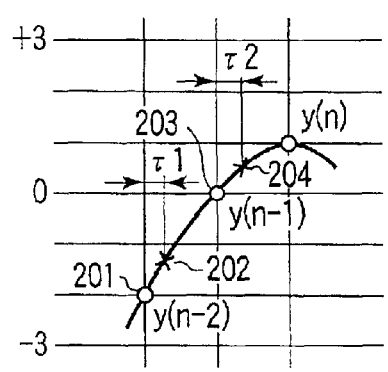
F I G. 21A
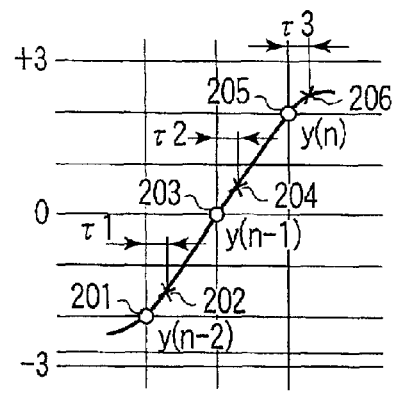
F I G. 21B
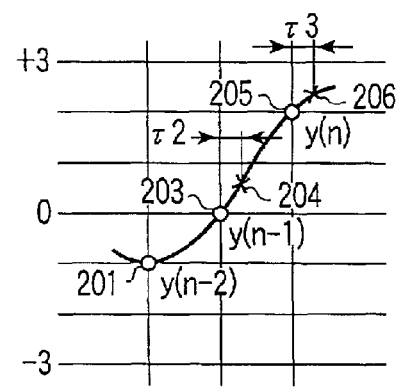
F I G. 21C
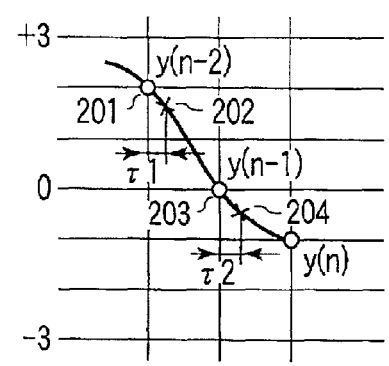
F I G. 21D
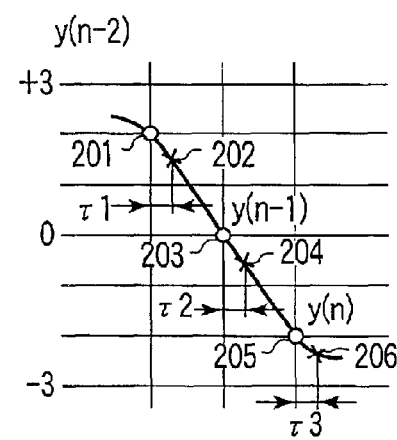
F I G. 21E
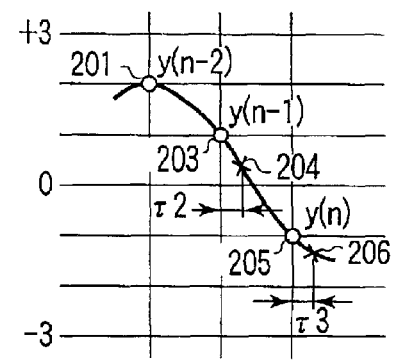
F I G. 21F

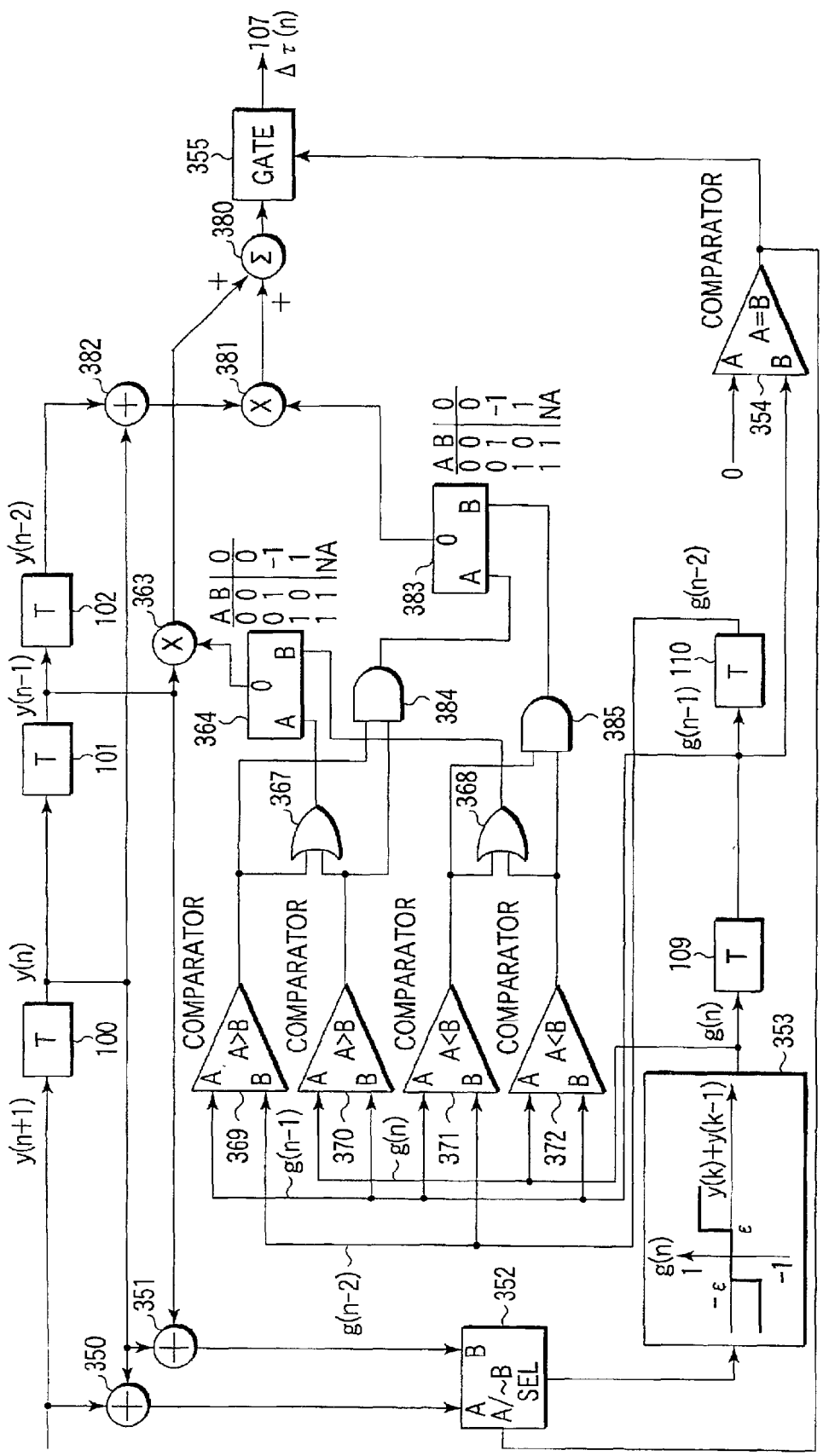
F I G. 23

DIGITAL DATA PLAY BACK APPARATUS AND METHOD FOR PLAYING BACK DIGITAL DATA

CROSS-REFERENCE TO RELATED APPLICATIONS

This application is based upon and claims the benefit of priority from the prior Japanese Patent Application No. 2000-385342, filed Dec. 19, 2000, the entire contents of which are incorporated herein by reference.

BACKGROUND OF THE INVENTION

The present invention relates to an improvement of a digital data play back apparatus and a method for playing back digital data which is optically, magnetically or opto-magnetically recorded on a recording medium such as, for example, a disc or the like.

As is already known, a play back signal processing system in a recording apparatus for optically, magnetically or opto-magnetically recording data pattern is generally constituted to obtain play back data by amplifying the play back signal read with a play back head from the recording medium and further equalizing a waveform of the play back signal with a waveform equalizer followed by inputting the play back signal to a data detection device to identify data and decoding the signal to obtain reproduction data.

That is, a distortion generated as a result of the passage of data through the recording channel is corrected with the waveform equalizer and a signal error detection ratio is suppressed within an allowance scope with the result that a peak position of the waveform is determined and a zero cross point is determined through differentiation. In the PRML (Partial Response Maximum Likelihood) signal processing method in recent years, a method is used which detects data as a sequence by making use of a correlation before and after the signal.

Here, in order to detect data, an interval in which data is recorded, namely, a channel clock frequency, and phase information thereof are required. This channel clock is recovered (restored) by using a PLL (Phase Locked Loop) from the played back signal.

In the data recorded on the recording medium, there is present at the initial portion of data a VFO region in which a signal is recorded in a single data repetition pattern repeated by integer times of the clock for recording data for timing recovery. The peak position of the VFO signal after the waveform equalization, and the position at which the signal crosses a specific threshold value are detected, and the channel clock is recovered thereby enabling synchronization to the frequency and phase of the recorded data.

The following data is detected by using this synchronized clock. However, because of the change in the rotational speed of discs or the like, the phase at the initial portion of data does not agree with the phase at the end portion of the data. Then, even during the play back of the data, the phase shift between the data detection timing and the play back clock by the PLL is feed back to the PLL thereby allowing the phase drift at the data portion to follow the clock.

Since the VFO region has a signal of a single frequency, a high quality phase signal can be obtained. However, since the data portion has a complicated waveform, the position at which the phase error can be detected is small, the quality thereof is lowered under the influence of the waveform interference. In the VFO region, the PLL is normally referred to as the "Acquisition mode" wherein the frequency is acquired at a high speed to follow the phase. However, in the data region, the PLL moves to the "trace mode" which is an operation in which the loop gain of the PLL is suppressed to a low level. In this trace mode, a mild frequency change like a rotational drifts can be followed, but a rapid change in bit unit by noises, waveform interference or the like cannot be followed.

In the PRML signal processing method, there are many cases in which the play back signal is quantized at a discrete time by using an A/D (Analogue/Digital) converter prior to the inputting of the play back signal to the waveform equalizer. In the sampling clock given to the A/D converter, the channel clock is used which is recovered by using the PLL.

FIGS. 1A through 1H are views showing a signal of an optical disc apparatus in the case where the play back signal is not sampled in a discrete time as used many times in the PRML signal processing, but the threshold value is detected in a continuous time to detect data.

The user data to be recorded is a data row which is a random combination of 0 and 1. In order to record the data on the recording medium, the number of 0's between 1 and 1 as shown in FIG. 1A is modulated according to a run length limit (RLL) code. The data writing signal is converted into a signal (FIG. 1B) in which the ON and OFF of data (FIG. 1A) is toggled at the position of 1 in the case of mark edge recording. As a consequence, a mark (FIG. 1C) is recorded on the recording medium. The play back signal (FIG. 1D) in the case where this mark (FIG. 1C) is read is allowed to pass through a differential circuit so that a differential waveform (FIG. 1E) can be obtained. The peak of the differential waveform (FIG. 1E) corresponds to the position of 1 of the data which is modulated with the RLL code of the data (FIG. 1A).

The channel clock recovered in the PLL circuit by using the signal of the VFO region may assume the state shown in FIG. 1G. If so, this clock (FIG. 1G) can form the data detection window (FIG. 1F). If the detection window (FIG. 1F) has a differential-waveform peak of 1, the detection data (FIG. 1H) can be acquired by outputting "0." The detection data (FIG. 1H) is RLL code data. Hence, the user data recorded can be recovered by allowing the detection data (FIG. 1H) to pass through the decoding circuit.

In the case where the phase of the play back signal and the phase of the channel clock synchronize each other, the peak of the differential signal (FIG. 1E) is located in the center of the data detection window (FIG. 1F). Consequently, although it is easy to detect whether or not the peak is present in the data detection window (FIG. 1F), the peak of the differential signal (FIG. 1E) is shifted to the end of the data detection window (FIG. 1F) along with the shift of the phase, so that the peak ultimately enters into the adjacent window thereby generating a detection error.

Then, as shown in FIG. 2, the phase error between the peak position of the differential waveform and the channel clock is detected with the phase comparator. And the error is converted into a voltage value with a charge pump to control the voltage control oscillator (VCO) as a result of the conversion. As a consequence, the clock phases which are recovered with the play back signal and the PLL can be allowed to synchronize each other.

In such method, a detection error is likely to be generated when the mark edge is not raised with the time in the data detection window. When the recording density is heightened, the rise of the edge becomes mild under the influence of the frequency response characteristics of the recording medium. In order to correct the rise to more abrupt rise, it is required to amplify the high frequency component characteristic with a waveform equalizer. However, since the noise component in a high frequency area is also raised in this correction, the S/N is deteriorated. Thus, in this signal processing method, there is a limit in the heightening of the density.

One method of overcoming this problem is a PRML signal processing method. In the PRML, since the influence of the response waveform to a certain bit is allowed to be exerted upon the adjacent bit or a plurality of bits, data can be recorded in a high density without emphasizing the high frequency component of the response of signal processing channel.

Instead of this, the degree of influence upon a plurality of bits is required to be controlled to a value determined with the PR class. Since the degree of the mutual interference between bits is controlled, the waveform having a mild change which cannot be detected in the threshold value is optimally detected (an ML detection) in a sequence of waveforms so that data can be detected without errors.

FIGS. 3A through 3F are views showing how the data row (FIG. 3A) which is the same as FIG. 1A will be represented with in the PRML method. FIG. 3C is a view showing a bit row wherein the case in which the writing signal (FIG. 3B) for each channel clock is turned on is set to 1 while the case in which the signal is turned off is set to 0. Now, suppose that the PR class is (1, 2, 2, 1) as shown in FIG. 3D.

In this PR equalization, it is intended to show that a response waveform played back from the channel in the case where the writing bit is 1 will be as shown in FIG. 3D. As shown in FIG. 3E, the play back waveform corresponding to the writing bit row (FIG. 3C) is represented as a superposition of the response waveform of each bit, so that the waveform shown in FIG. 3F can be obtained.

Thus, in the case of the PR equalization, what is controlled with the PR equalizer and is used for the input of the ML detector is the amplitude value at the time of sampling. Consequently, in the PRML signal processing, the play-back signal is converted into an amplitude value system quantified at the discrete time for each channel clock with the A/D converter before the play back signal is input to the equalizer. After that the play back signal is processed with the digital circuit in almost all the cases.

In the PLL phase error detector used in the PRML signal processing system optical disc apparatus, an output signal of the equalizer is made discrete in the direction of time. Unlike the method explained by using FIGS. 1A through 1H, the data phase and the phase of the channel clock to be recovered with the PLL cannot be directly compared with each other. It is necessary to convert a shift in the sampled amplitude value into a phase error.

For example, U.S. Pat. No. 4,890,299 discloses a method for converting a shift in the amplitude value into a phase error and a structure thereof. A calculation is made as to what degree of timing phase gradient has either in the plus or minus direction from the current amplitude value, amplitude values before one or two samples, and an ideal equalization amplitude corresponding to the values.

However, what is disclosed here is a case in which an ideal value of the play back waveform after the PR equalization becomes three levels. When the recording density becomes high, the frequency response of the medium becomes relatively insufficient so that the PR class needs to be raised. However, since the points of samples in which waveforms mutually interferes with each other increases in these classes, the amplitude level increase after the equalization of the waveform with the result that the phase error cannot be detected in the method in which the three levels are assumed.

How many levels the waveform value is divided into after the PR equalization depends upon the PR class and the modulation method used. As in the examples of FIGS. 3A to 3F, the waveform value is divided into five level (0, 1, 3, 5 and 6) if the levels (1, 2, 2, 1) are used as the PR class and if PLL (2, 7), wherein the minimum number (d constraint) of 0s existing between "1" and "1" is limited to 2, is used as modulation method.

Even if the same PR class, i.e., the levels (1, 2, 2, 1) is used, the waveform value will be divided into seven levels (0, 1, 2, 3, 4, 5 and 6) in the case where the d constraint is 0 or the PLL (1, 7), wherein the d restriction is limited to 1, is used as modulation method. This holds true when the maximum number (k constraint) of 0s existing between "1" and "1" is 4 or more.

In this manner, in the case of the class in which the level of the waveform value after the PR equalization is 5 through 7, it is impossible to calculate the timing phase gradient from the amplitude value of the waveform in the method disclosed in U.S. Pat. No. 4,890,299.

Incidentally, with respect to this problem, as shown in Jpn. Pat. Appln. KOKAI Publication No. 2000-195191 filed by the same applicant of the present invention, a countermeasures technique is already filed which facilitates a phase synchronization between data and a block by detecting a timing phase gradient from the amplitude value sampled at a discrete time also in the PR class in which the amplitude value after equalization becomes 5 through 7 levels. However, in the current situation in which technical development is briskly made, there can be seen a tendency that a countermeasures having a different structure is also desired.

BRIEF SUMMARY OF THE INVENTION

The present invention has been made in view of the above circumstances, and an object of the invention is to provide a digital data play back apparatus and a method for playing back digital data which enables a synchronous control of the recovered channel clock with the data played back in the user data region in the case of the PR class in which the level of the waveform value after the PR equalization becomes 5 through 7.

The digital data play back apparatus according to the present invention comprises:

a conversion portion for converting a signal read from a recording medium into digital data by sampling the signal in a clock frequency output from a variable frequency oscillation portion;

an equalizing portion for equalizing digital data output from this conversion portion into a waveform which agrees with a partial response class on the basis of a clock output from a variable frequency oscillation portion;

a data detection portion for detecting data on the basis of a clock output from the variable frequency oscillation portion with respect to the signal waveform output from this equalizing portion;

a timing phase gradient detection portion for detecting a gradient of a phase error between a signal waveform output from the equalization portion and a clock output from the variable frequency oscillation portion; and a control portion for controlling the oscillation frequency of the variable frequency oscillation portion on the basis of the timing phase gradient detected with the timing phase gradient detection portion.

Furthermore, the method for playing back digital data according to the present invention, comprising:

a first step of converting a signal read from the recording medium into digital data by sampling the signal in a clock frequency output from a variable frequency oscillation portion;

a second step of equalizing the digital data output at the first step into a waveform which agrees with a partial response class on the basis of a clock output from the variable frequency oscillation portion;

a third step of detecting data on the basis of the clock output from the variable frequency oscillation portion with respect to the signal waveform output at the second step a fourth step of detecting a gradient of a phase error between a signal waveform output at the second step and a clock output from the variable frequency oscillation portion; and a fifth step of controlling the oscillation frequency of the variable frequency oscillation portion on the basis of the timing phase gradient detected at the fourth step.

According to the above structure and the above method, since the timing phase gradient can be detected from the amplitude value sampled at the discrete time also in the PR class in which the amplitude level after equalization becomes a value of 5 through 7, a synchronous control of the data played back in the user data region and the recovered channel is enabled with high reliability also in the case of the PR class in which the amplitude level after equalization becomes 5 through 7.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A through 1H are views for explaining a timing relation between a writing signal and a read-out signal with respect to an optical disc apparatus respectively;

FIG. 2 is a block structure diagram shown for explaining a PLL for allowing a phase of a play back signal and a phase of a channel clock in the optical disc apparatus to agree with each other;

FIGS. 3A through 3F are views for explaining a timing relation between a writing signal and a read-out signal on the basis of the PRML method in the optical disc apparatus respectively;

FIG. 4 is a block structure diagram for explaining an outline of the optical disc apparatus, the view showing a first embodiment of the present invention;

FIG. 5 is a block structure diagram shown for explaining another example in which the read channel clock and the play back signal are allowed to synchronize with each other in the first embodiment;

FIGS. 7A through 7F are views for explaining a VFO pattern for detecting a timing phase gradient in the first embodiment respectively;

FIGS. 9A and 9B are views for specifically explaining an operation of detecting the timing phase gradient in the first embodiment respectively;

FIGS. 19A through 19F are views shown for explaining a state of transition of the waveform in the case in which g(n−1) is other than 0 in the third embodiment respectively;

FIGS. 21A through 21F are views for specifically explaining an operation of detecting a timing phase gradient in the third embodiment respectively;

FIG. 23 is a block structure diagram shown for explaining in detail the timing phase gradient detection circuit, the view showing a fourth embodiment of the present invention;

DETAILED DESCRIPTION OF THE INVENTION

Figure 6:
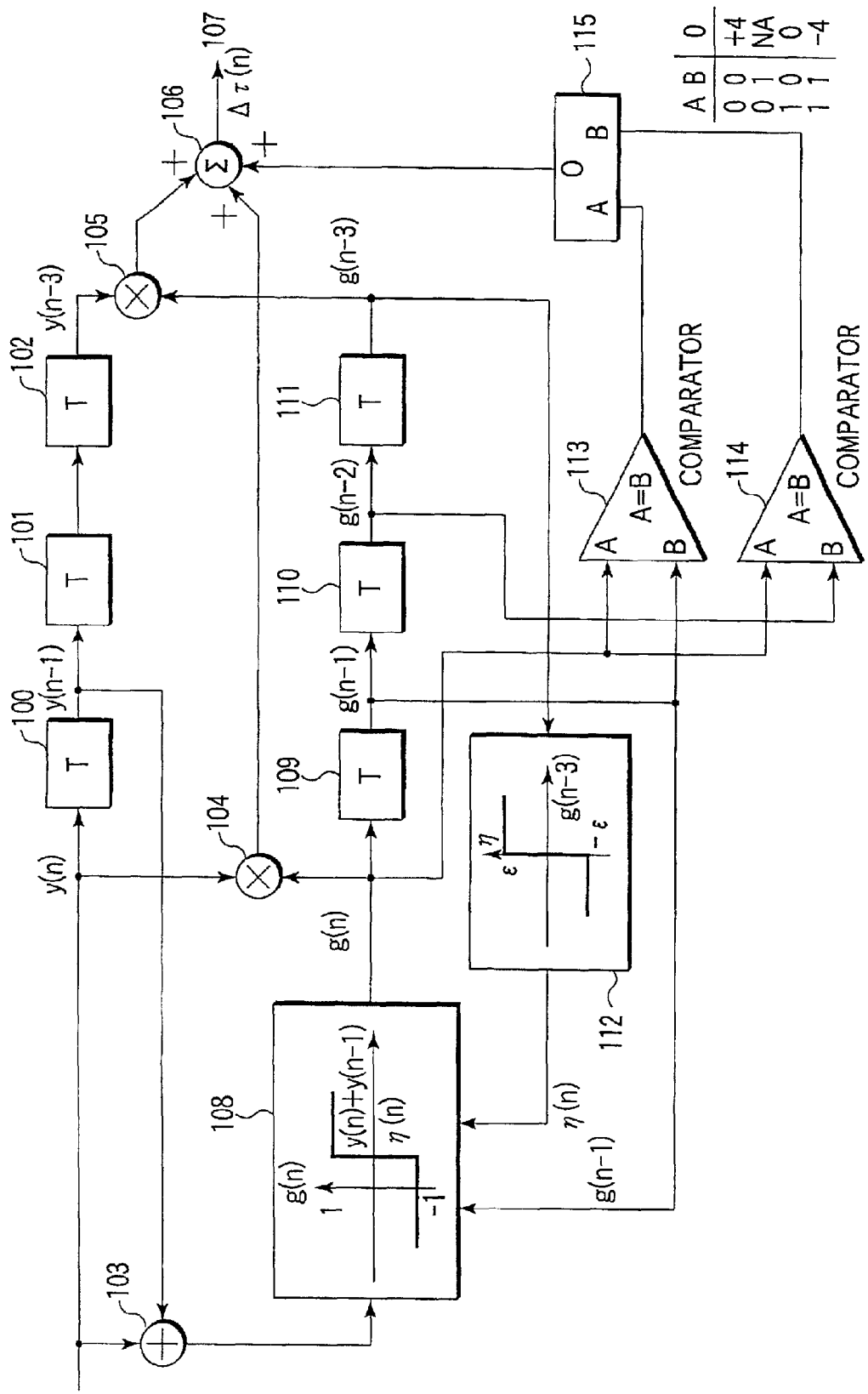
FIG. 6 is a block structure diagram for explaining the details of a timing phase gradient detection circuit in the first embodiment.

Hereinafter, a first embodiment of the present invention will be explained in detail by referring to the drawings. FIG. 4 is a view showing an essential portion of an optical disc apparatus which will be explained in the first embodiment. That is, the optical disc apparatus primarily comprises a rewritable disc 1 which is a recording medium, an optical head 3 for writing and reading data to the optical disc 1, a data play-back system, a data recording system, a drive controller 12 and an interface 13.

The optical disc 1 is rotated and driven with a spindle motor 2. The optical head 3 is moved and adjusted with a servomotor 4, so that laser light is applied to the optical disc 1 with the drive by the laser driver 15 thereby optically recording and playing back information. The spindle motor 2 and the servomotor 4 are driven and controlled with a drive controller 12 via a drive control circuit 14.

The data recording system has a laser driver 15 and a modulation circuit 16. The modulation circuit 16 conducts coding processing for converting record data sent from the drive controller 12 into a predetermined code bit row. The laser driver 15 drives the optical head 3 so as to record on the optical disc 1 a mark which follows a code bit row output from the modulation circuit 16.

The data play back system has a preamplifier 5, a VGA (variable gain amplifier) 6, an A/D conversion circuit 7, an equalizer 8, a data detection circuit 10 and a decoder 11. The preamplifier 5 and the VGA 6 amplify the playback signal read by the optical head 3. The A/D conversion circuit 7 quantizes the playback signal at a sampling period, thereby converting the playback signal to a digital signal that consists of time-discrete sampled values. The equalizer 9 processes the digital signal, generating a signal having a waveform that agrees with the PR class.

The data detection circuit 10 is a signal processing circuit of the optimal row estimation method signal processing circuit for detecting data from the play-back signal waveform which is equalized to a predetermined class of a partial response, and the data detection circuit 10 specifically comprises a bit a bit detector. The decoder 11 restores a code bit row detected with the data detection circuit 10 to original user data.

The drive controller 12 is the main controller of the optical disc apparatus, and is connected to, for example, a personal computer via the interface 13 to conduct the transmission control of the record data and the play back of data. The apparatus includes a motion picture compression circuit, a motion picture expansion circuit and an error detection circuit, either not shown in the drawing. The motion picture compression circuit and the motion picture expansion circuit records and reproduces image information. The error detection circuit detects errors from the data output from the decoder 11 and corrects the errors detected.

An output of the equalizer 8 is also input to the timing phase gradient detection circuit 18 which is a part of the timing control circuit 17. An output of this timing phase gradient detection circuit 18 is input to a VCO (a voltage control oscillator) 20 through a loop filter 19 to control the phase of the channel clock. An output of this VCO 20 is provided as a recovered channel clock, a sampling clock of the A/D conversion circuit 7 and an operation clock of the equalizer 8 and the data detection circuit (an ML detector) 10.

In an example shown in FIG. 4, the sampling frequency and the phase of the A/D conversion circuit 7 are synchronized with the play back signal by means of VCO 20. FIG. 5 is a view showing another example in which the reading clock is synchronized with the play back signal. In FIG. 5, another example is shown with respect to a portion from the VGA 6 to the data detection circuit 10.

That is, the sampling clock of the A/D conversion circuit 7 is supplied from a synthesizer 602. This sampling clock is a clock having a frequency which is somewhat higher than a channel clock period of the play back signal, and the sampling clock is not synchronized with the play back signal. An output of the equalizer 8 is shifted and output with an interpolation filter 600 by a value at which only the phase is controlled with the output of the phase calculation circuit 601.

An output of this interpolation filter 600 is input to the timing phase gradient detection circuit 18. An output of this timing phase gradient detection circuit 18 is input to a phase calculation circuit 601 via the loop filter 19, so that a shift amount of the phase in the interpolation filter 600 is controlled. A clock control 603 thins out the output of the synthesizer 602 so as to agree with the play back signal frequency on the basis of the phase control information from the phase calculation circuit 601 thereby supplying the output as an operation clock of the data detection circuit 10.

In the following explanation, it is supposed that the PR class of this PRML signal processing system is set to (1, 2, 2, 1). An operation of the timing phase gradient detection circuit 18 in this first embodiment will be explained by using FIG. 6. Thereafter, the amplitude value of the play back signal sampled in the nth sampling period is denoted by y(n).

A timing phase gradient detection circuit 18 shown in FIG. 6 is a circuit for efficiently detecting a timing phase gradient with respect to the VFO pattern shown in FIG. 7A. The VFO pattern refers to a dedicated data pattern for conducting phase matching at a high speed, and is a repeated pattern of a single frequency shown in FIG. 7A.

In an example of the pattern shown in FIG. 7A, the amplitude value of the PR equalized sample point becomes a repetition of values such as 1, 1, 3, 5, 5, 3, 1, 1, . . . in the case where the sampling phase matches. However, for the simplification of the explanation on the numeric value processing, it is supposed that the value of y(n) can assume the values of −3 through +3 centering on the level of 3 after the PR equalization processing. That is, the PR equalization output level of 1, 1, 3, 5, 5, 3, 1, 1 becomes −2, −2, 0, +2, +2.

Reference numerals 100 through 102 of FIG. 6 denote a delay circuit for outputting input sample values by delaying the values in one sampling period. In the case where the input of the delay circuit 100 is y(n), the output of each of the delay circuits 100 through 102 becomes y(n−1), y(n−2) and y(n−3) respectively.

Reference numerals 109 through 111 of FIG. 6 also denote delay circuits for outputting input sample values by delaying the values in one sampling period. In the case where the input of the delay circuit 109 is g(n), the output of each of the delay circuits 109 through 111 becomes g(n−1), g(n−2) and g(n−3) respectively.

Here, g(n) denotes a value representing a direction of change of the amplitude value y(n) of the play back signal which is sampled in the nth sampling period. That is, the samples 150 through 152 of the waveform shown in FIG. 7F are defined as having a direction of +1 while the samples 153 through 155 are defined as having a direction of −1.

Reference numeral 108 denotes a threshold value judging circuit which judges the direction of the change of y(n) from y(n) and y(n−1) which are added with the addition circuit 103. As the threshold value η(n) for judgment, the output of the threshold value determining circuit 112 is used. In the threshold value determining circuit 112, the direction g(n−3) of the change before three sample time is input. Then in the case where the value is +1, the value of +ε is output while the value of −ε is output in the case where the value is −1.

The threshold value judging circuit 108 inputs the value of g(n−1). When g(n−3) is +1, −1 is output as g(n) in the case where y(n)+y(n−1) becomes +ε or less thereby reversing the direction of change. However, in the case where the condition is not met, the value same as g(n−1) is output. When g(n−3) is −1, +1 is output as g(n) in the case where y(n)+y(n−1) becomes −ε or less thereby reversing the direction of change. In the case where the condition is not met, the value same as g(n−1) is output.

The addition circuit 106 adds the outputs of the multiplication circuits 104 and 105 and an output of the correction value output circuit 115, generating a timing phase gradient Δτ 107. The multiplication circuit 104 finds the product of y(n) and g(n), while the multiplication circuit 105 finds the product of y(n−3) and g(n−3). The correction value output circuit 115 outputs the correction value for calculating the timing phase gradient Δτ 107 in the phase error in accordance with the comparison result of the comparator 113 and the comparison result of the comparator 114.

Figure 8A:
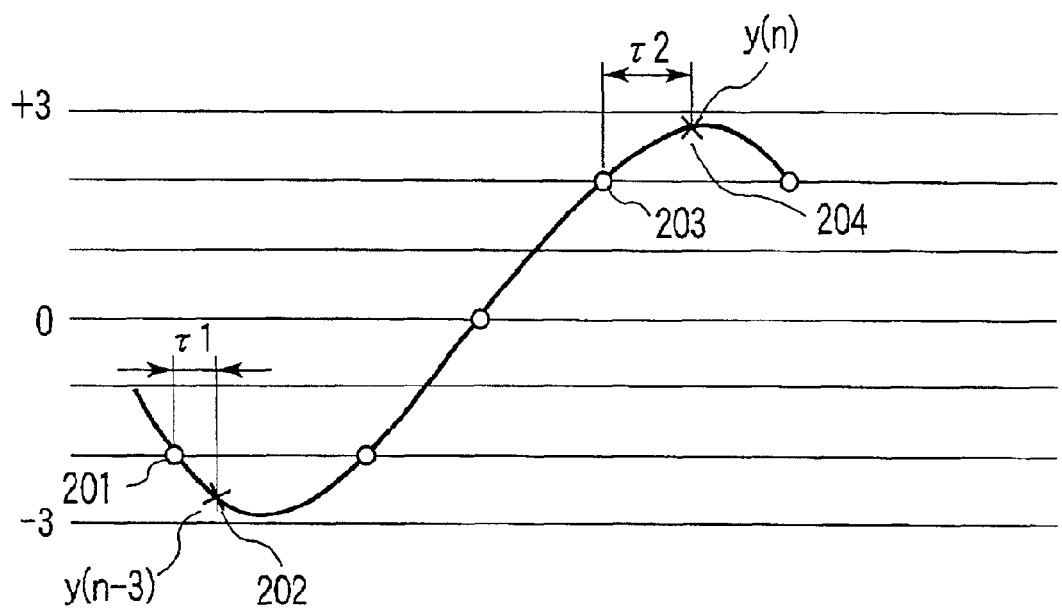
FIGS. 8A and 8B are views for specifically explaining an operation of detecting the timing phase gradient in the first embodiment respectively.

By using FIG. 8A and FIG. 8B and FIGS. 9A and 9B, more specific explanation will be given. In FIG. 8A, the actual sample value 204 is such that the amplitude value is +2+γ because of the phase error τ2 with respect to the amplitude value 203 in the case where the phase of y(n) matches. Furthermore, the actual sample value 202 is such that the amplitude value is set to −2−β because of the phase error τ1 with respect to the amplitude value 201 in the case where the phase of y(n−3) matches. Furthermore, since g(n) is +1, and g(n−3) is −1 as a direction of change, the output of the multiplication circuit 104 becomes $$(+2+\gamma) \times (+1) = +2+\gamma$$

while the output of the multiplication circuit 105 becomes $$(-2-\beta) \times (-1) = +2+\beta.$$

Furthermore, the output of the comparator 113 becomes 1 from g(n)=g(n−1) because g(n)=+1 and g(n−1)=+1 are set.

The output of the comparator 114 becomes 1 from g(n)=g(n−2) because g(n)=+1 and g(n−2)=+1 are set. Then, the output of the correction value output circuit 115 becomes −4.

From this fact, the timing phase gradient Δτ 107 in the phase error becomes (+2+γ)+(+2+β)−4=γ+β. Then, the shift from the PR equalization reference value, the sum of γ and β is output as the timing phase gradient in the phase error.

Figure 8B:
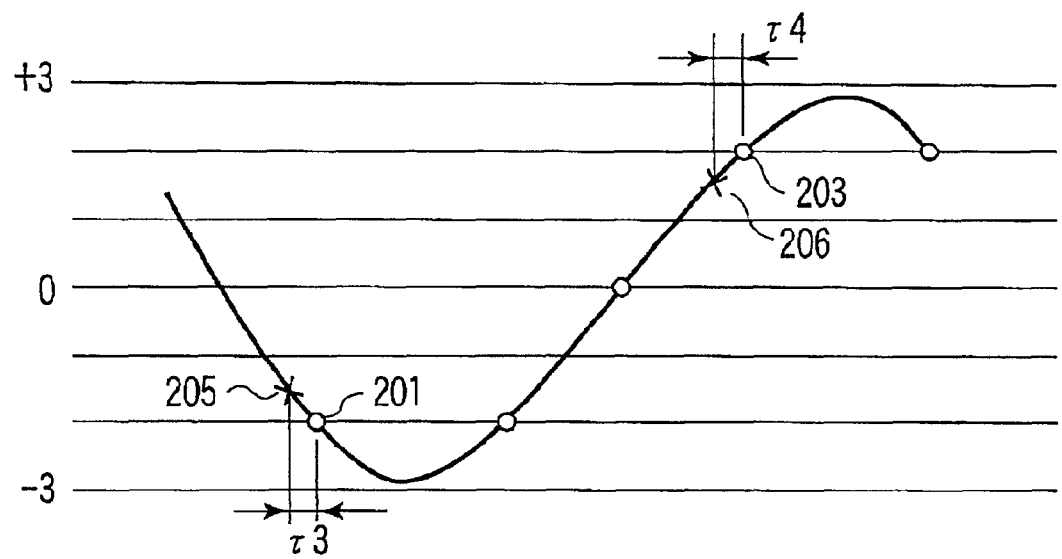

FIG. 8B is a view showing an example in which the phase error is in the reverse direction. That is, the output of the multiplication circuit 104 is $$(+2-\gamma) \times (+1) = +2-\gamma.$$

The output of the multiplication circuit 105 becomes $$(-2+\beta) \times (-1) = +2-\beta.$$

Furthermore, the output of the comparator 113 becomes 1 from g(n)=g(n−1) because g(n)=+1 and g(n−1)=+1 are set.

The output of the comparator 114 becomes 1 from g(n)=g(n−2) because g(n)=+1 and g(n−2)=+1 are set, and the output of the correction value output circuit 115 becomes −4.

From this fact, the timing phase gradient Δτ 107 in the phase error becomes $$(+2-\gamma)+(+2-\beta)-4=-\gamma-\beta.$$

Then the shift from the PR equalization reference value, the sum of −γ and −β is output as the timing phase gradient.

The output of the multiplication circuit 104 becomes $$(+2-\gamma) \times (-1) = -2+\gamma$$

because g(n) is −1 and g(n−3) is +1 in the case where y(n) is as shown in FIG. 9A. The output of the multiplication circuit 105 becomes (−2+β)×(+1)=−2+β.

The output of the comparator 113 is 0, because the input g(n) (=−1) and the input g(n−1) (=+1) are not equal. The output of the comparator 114 is 0, because the input g(n) (=−1) and the input g(n−2) (=+1) are not equal. Thus, the output of the correction value output circuit 115 is +4.

From this fact, the timing phase gradient Δτ 107 in the phase error will become (−2+γ)+(−2+β)+4=γ+β. Then, the shift from the PR equalization reference value, the sum of γ and β is output as the timing phase gradient.

In the case where y(n) is as shown in FIG. 9B, g(n) is −1, g(n−3) is +1 so that the output of the multiplication circuit 104 will be $$(-\gamma) \times (-1) = +\gamma.$$

The output of the multiplication circuit 105 becomes 1 (+β)×(+1)=+β.

The output of the comparator 113 is 1, because the input g(n) (=−1) and the input g(n−1) (=−1) are equal. The output of the comparator 114 is 0, because the input g(n) (=−1) and the input g(n−2) (=+1) are not equal. The output of the correction value output circuit 115 is therefore 0.

From this fact, the timing phase gradient Δτ 107 in the phase error will be $$(+\gamma)+(+\beta)=\gamma+\beta.$$

Then, a shift from the PR equalization reference value, the sum of γ and β is output as the timing phase gradient.

Hereinbelow, in the same manner, the shift amount from the reference value of the amplitude generated from the phase error is correctly output as the timing phase gradient.

Figure 10:
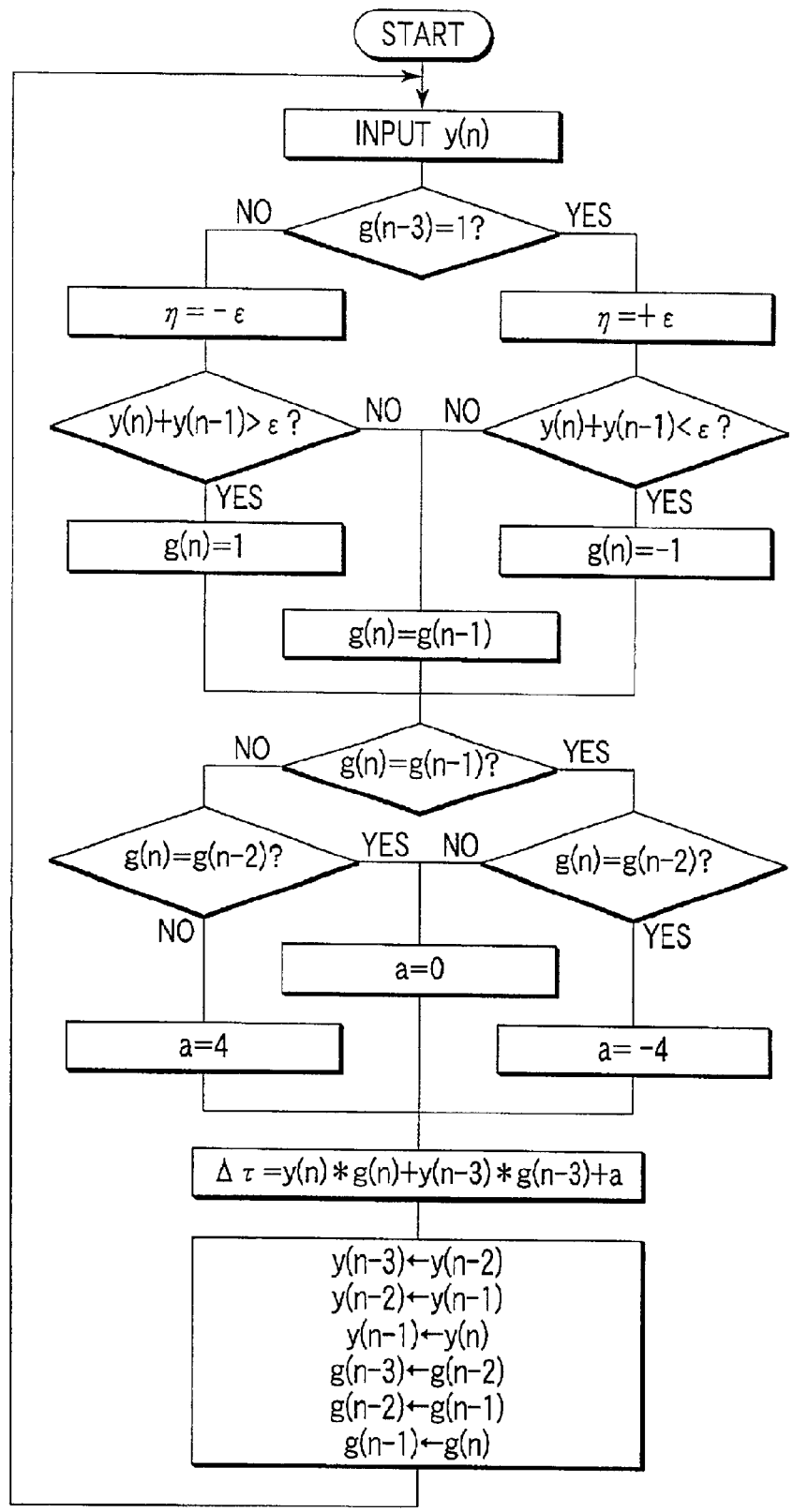
FIG. 10 is a flowchart shown for explaining in summary an operation for detecting the timing phase gradient in the first embodiment.

FIG. 10 is a flowchart showing in summary the operation according to the first embodiment.

In the first embodiment, the present sample value y(n) and the sample value y(n−1) obtained at the immediately preceding sample time are applied to determine the timing phase gradient. Only the value y(n) suffices to determine the timing phase gradient correctly if the signal has no noise. If the signal has noise, the possibility of error in determining the timing phase gradient will increase. To determine the timing phase gradient accurately, two peaks of the signal waveform are inferred by using two sample points, thereby determining whether the amplitude of the signal is increasing or decreasing. Thus, above averaging, minimizing the influence of the noise. It is therefore possible to calculate the timing phase gradient at high accuracy.

Figure 11:
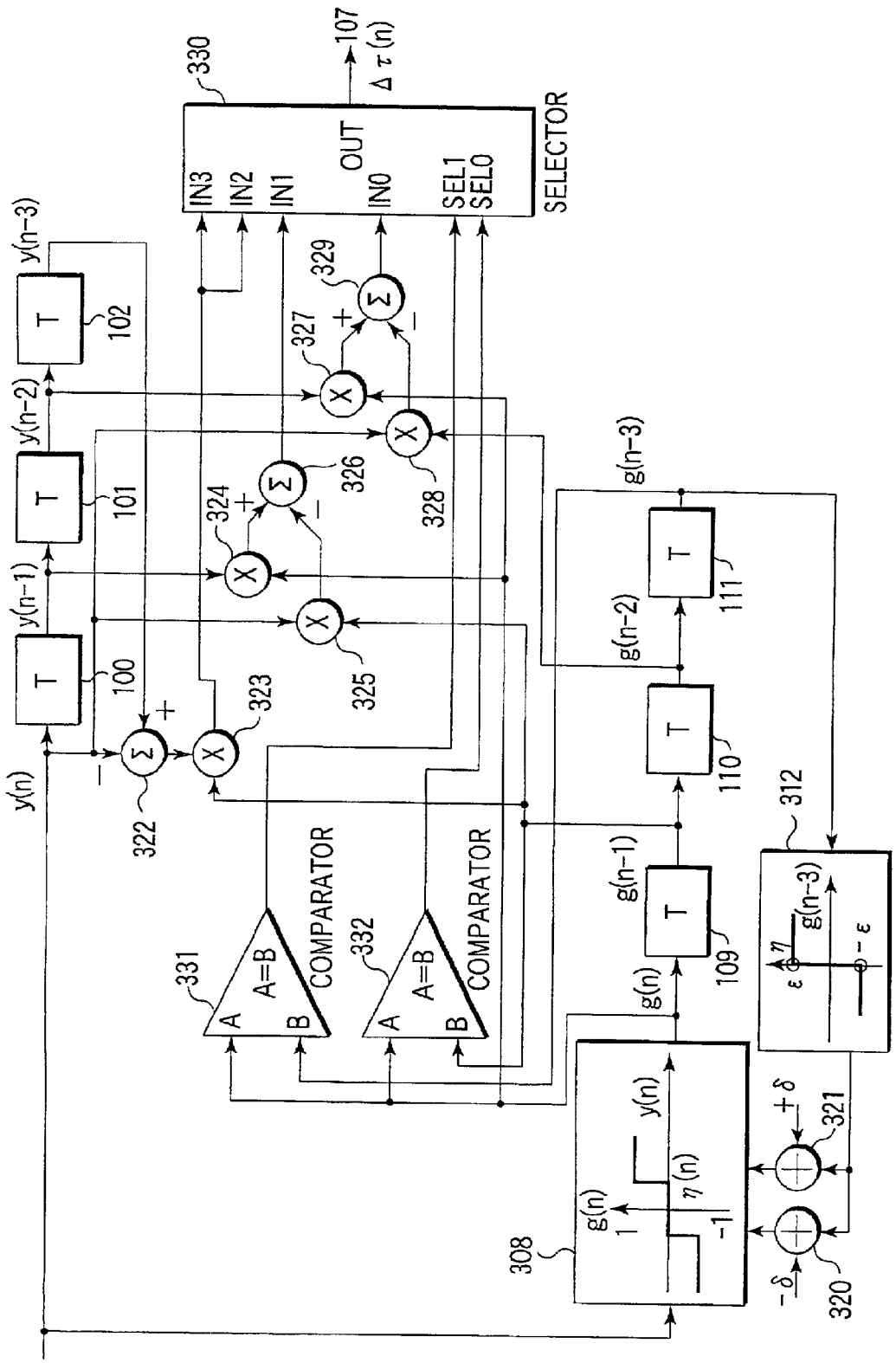
FIG. 11 is a block structure diagram for explaining the details of the timing phase gradient detection circuit, the view showing a second embodiment of the present invention.

FIG. 11 is a view showing a timing phase gradient detection circuit 18 according to a second embodiment of the present invention. This timing phase gradient detection circuit 18 is also a circuit for efficiently detecting the timing phase gradient with respect to the VFO pattern shown in FIG. 7A.

Reference numerals 100 through 102 of FIG. 11 denote a delay circuit for outputting the input sample value 18 with a delay of one sampling period in the same manner as FIG. 6. In the case where the input of the delay circuit 100 is set to y(n), the output of each of the delay circuit 100 through 102 becomes $$y(n-1), y(n-2) \text{ and } y(n-3).$$

Reference numerals 109 through 111 denote a delay circuit for outputting input sample values with a delay of one sampling period. In the case where the input of the delay circuit 109 is set to g(n), the output of each of the delay circuits 109 through 111 will be g(n-1), g(n-2) and g(n-3).

Here, g(n) is a value representing which of the reference values +2, 0 and -2 after the PR equalization the level of the amplitude value y(n) of the play back signal which is sampled in the nth sampling period should be regarded as. When the amplitude value y(n) should be regarded as +2, g(n) is +1. When the amplitude value y(n) should be regarded as 0, g(n) is 0. When the amplitude value y(n) should be regarded as -2, g(n) is -1. For the sake of convenience, this g(n) is referred to as judgment level in the following explanation.

Furthermore, reference numeral 308 denotes a threshold value judging circuit for judging the value which g(n) should assume from the value of y(n). The value is separated into η(n)-δ which is a judgment threshold value of +1 and 0, and η(n)+δ which is a judgment threshold value of 0 and -1 by adding -δ and +δ to the output η(n) of the threshold value determining circuit 312 with the addition circuit 320 and 321 to be input to the threshold value judging circuit 308.

This threshold value determining circuit 312 inputs the judgment level of g(n-3) before three sample time. In the case where the value is +1, the value of +η is output. When the value is -1, the value of -δ is output. When the value is 0, the 0 is output.

Then, the threshold value judging circuit 308 outputs -1 as g(n) when y(n) becomes +ϵ-δ or less in the case of g(n-3)=+1 while the threshold value judging circuit 308 outputs 0 as g(n) in the scope of +ϵ±δ. The threshold value judging circuit outputs +1 when y(n) becomes +ϵ+δ. Besides, the threshold value judging circuit 308 outputs -1 as g(n) when y(n) becomes -δ or less in the case of g(n-3)=0 while the threshold value judging circuit 308 outputs 0 in the scope of +ϵ±δ. Then, the threshold value judging circuit 308 outputs +1 as g(n) when y(n) becomes +δ or more. Furthermore, the threshold value judging circuit 308 outputs +1 as g(n) when y(n) becomes -ϵ+δ or more in the case of g(n-3)=-1. The threshold value judging circuit 308 outputs 0 as g(n) in the scope of -ϵ±δ while the threshold value judging circuit 308 outputs -1 as g(n) when y(n) becomes -ϵ+δ or less.

The timing phase gradient Δτ 107 in the phase error is output as the timing phase gradient value selected by the selection circuit 330 on the basis of the comparison result of the comparators 331 and 332. That is, when g(n) and g(n-1) are not equal to each other and the g(n) and g(n-3) are not equal to each other, the value of (-1)×y(n)×g(n-2)+y(n-2)× g(n) is output which is calculated in the addition circuit 329 and the multiplication circuit 327 and 328.

Furthermore, in the case of g(n)=g(n-1) and, at the same time in the case where g(n) is not equal to g(n-3), the value of (-1)×y(n)×g(n-1)+y(n-1)×g(n) is output which is calculated with the addition circuit 326 and the multiplication circuits 324 and 325.

Furthermore, in the case of g(n)=g(n-3), the value of g(n-1)×[-y(n)+y(n-3)] is output which is calculated in the addition circuit 322 and the multiplication circuit 323.

Figure 12A:
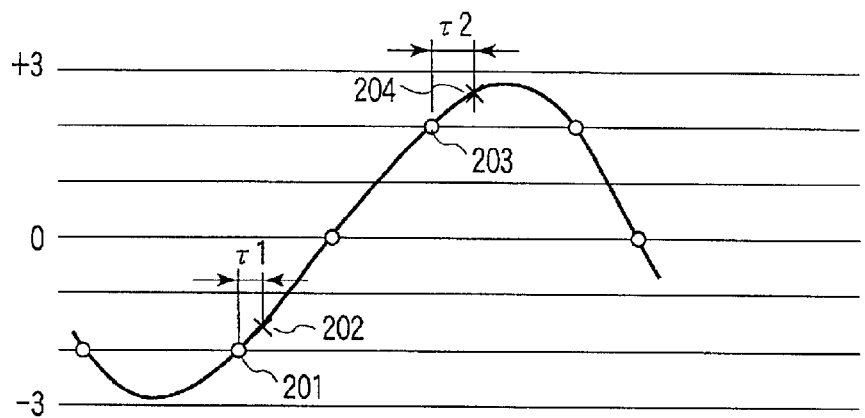
FIG. 12A and FIG. 12B are views for specifically explaining an operation of detecting a timing phase gradient in the second embodiment, respectively.

The operation will be explained more specifically by using FIGS. 12A and 12B and FIG. 13. In the beginning, in FIG. 12A, the actual sample value 204 is such that the amplitude value is +2+γ because of the phase error τ2 with respect to the amplitude value 203 in the case where the phase of y(n) matches. In this case, the calculation value selected as the timing phase gradient will be (-1)×y(n)×g(n-2)+y(n-2)×g(n) because g(n)=+1, g(n-1)=0, g(n-2)=-1, and g(n-3)=-1.

The actual sample value 202 with respect to the amplitude value 201 in the case where the phase of y(n-2) matches is such that the amplitude value is -2+β because of the phase error τ1. As a consequence, the following result is obtained.

$$(-1)\times(+2+\gamma)\times(-1)+(-2+\beta)\times(+1)=+\gamma+\beta$$

A shift from the PR equalization reference value, namely the sum of γ and β is output as the timing phase gradient.

Figure 12B:
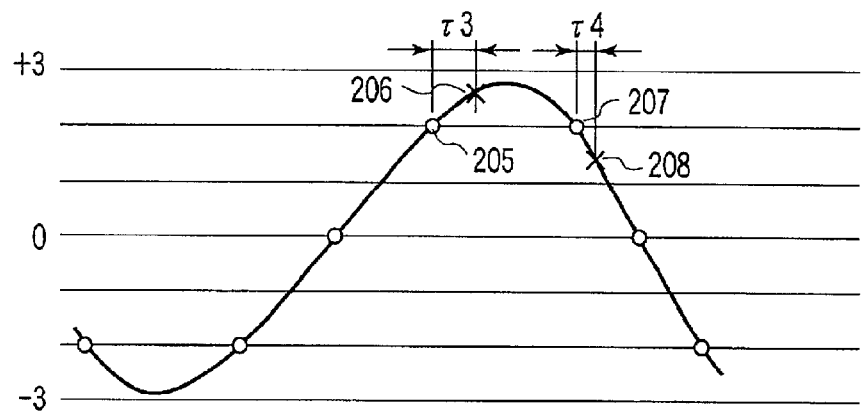

In FIG. 12B, it is supposed that the actual sample value 208 is such that the amplitude value is +2-γ because of the phase error τ4 with respect to the amplitude value 207 in the case where the phase of y(n) matches. In this case, g(n)=+1, g(n-1)=+1, g(n-2)=0, g(n-3)=-1, so that the calculation value selected as the timing phase gradient is $$(-1)\times y(n)\times g(n-1)+y(n-1)\times g(n).$$

It is supposed that the actual sample value 206 is such that the amplitude value is +2+β because of the phase error τ3 with respect to the amplitude value 205 in the case where the phase of y(n-1) matches. As a consequence, the following result is obtained.

$$(-1)\times(+2-\gamma)\times(+1)+(+2+\beta)\times(+1)=+\gamma+\beta.$$

A shift from the PR equalization reference value, namely the sum of γ and β will be output as the timing phase gradient.

Figure 13:
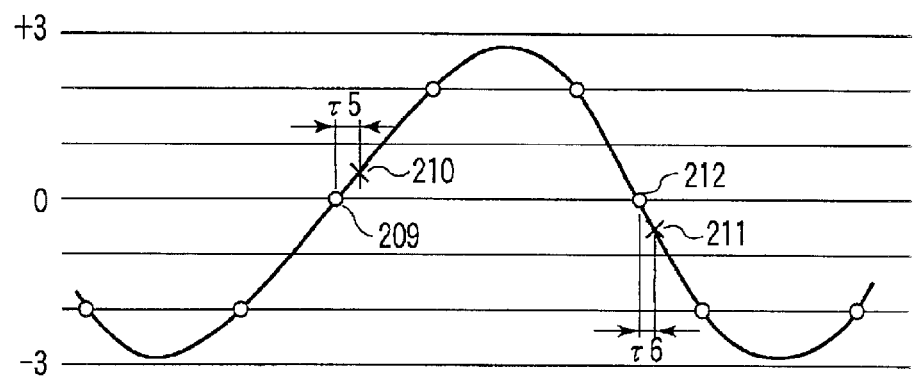
FIG. 13 is a view shown for specifically explaining an operation of detecting the timing phase gradient in the second embodiment.

In FIG. 13, it is supposed that the actual sample value 211 is such that the amplitude value is -γ because of the phase error τ6 with respect to the amplitude value 212 in the case where the phase of y(n) matches. In this case, the calculation value selected as the timing phase gradient will be g(n-1)× [-y(n)+y(n-3)] because g(n)=0, g(n-1)=+1, g(n-2)=+1, g(n-3)=0 are set.

Suppose that the actual sample value 210 is such that the amplitude value is +β because of the phase error of τ5 with respect to the amplitude value 209 in the case where the phase of y(n-3) matches. Then, the following result will be obtained.

$$(+1)\times(-1)\times(-\gamma)+\beta=+\gamma+\beta$$

A shift from the PR equalization reference value, namely, the sum of γ and β is output as the timing phase gradient.

Figure 14:
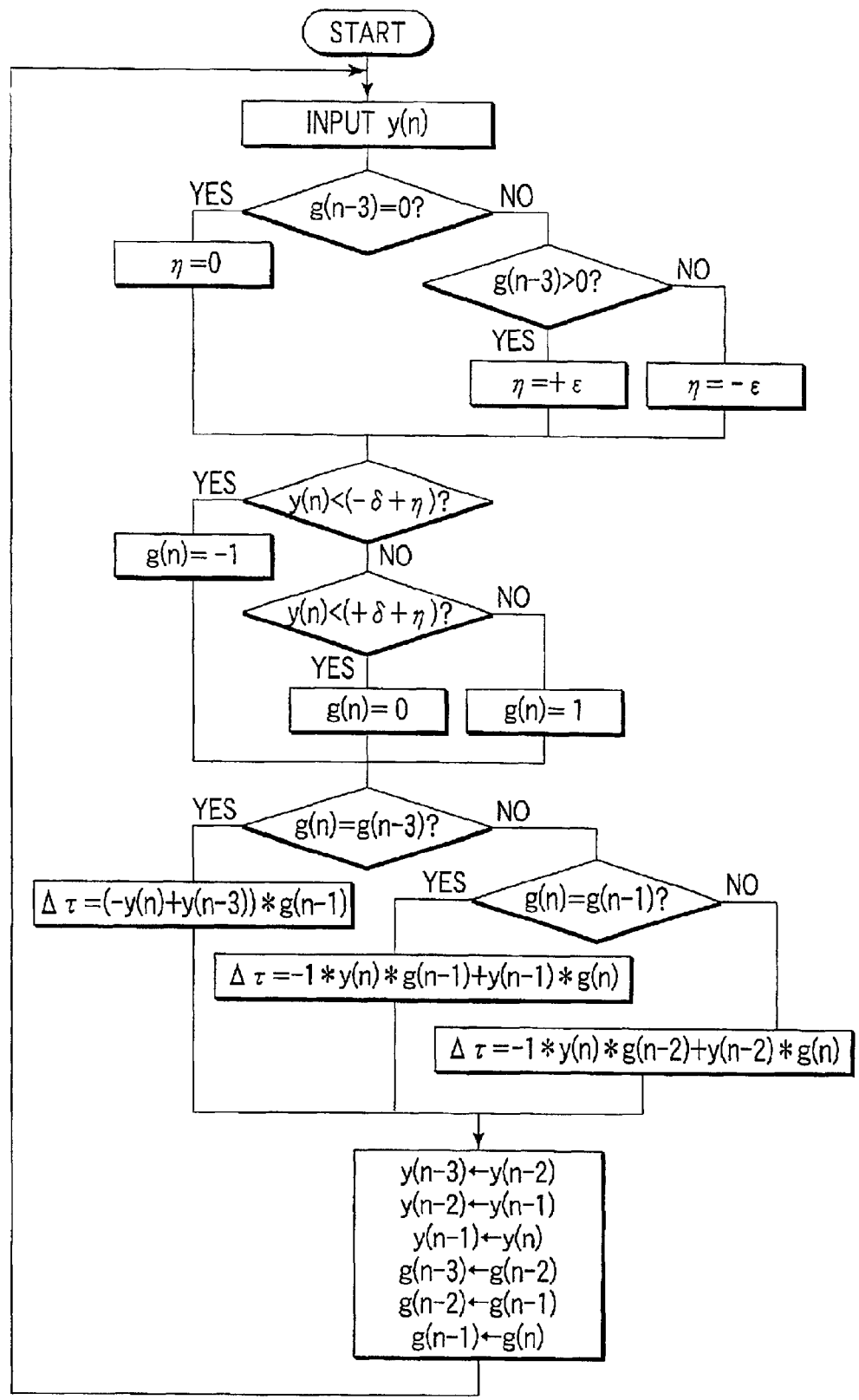
FIG. 14 is a flowchart shown for explaining in summary an operation of detecting the timing phase gradient in the second embodiment.

FIG. 14 is a flowchart showing in summary an operation in the second embodiment.

According to the second embodiment, the timing phase gradient can be efficiently detected by changing over the calculation method of the timing phase gradient on the basis of the history of the amplitude level which is assumed to be the assumed amplitude level.

In the first and the second embodiment described above, it is intended to determine the timing phase gradient with respect to the single frequency VFO pattern. However, even after the phase is acquired from the VFO pattern, a relatively mild phase change such as rotation drift or the like must be allowed to follow the clock. Since the user data portion is a signal generated by a random data series, the timing phase gradient cannot be obtained in a method similar to the VFO portion.

Figure 15C:
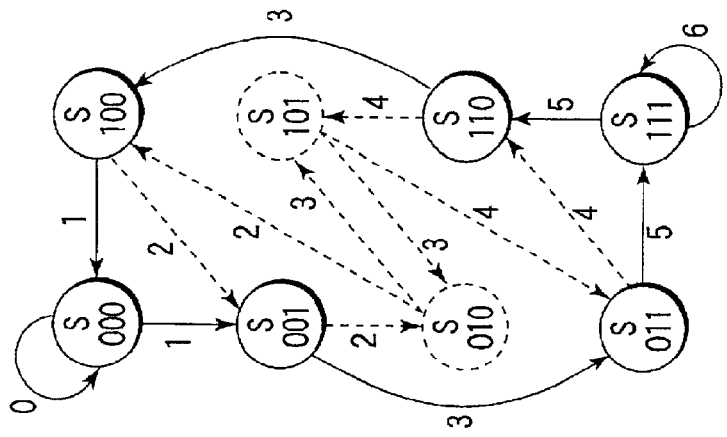
FIGS. 15A through 15C are state transition diagrams for explaining how the amplitude value of the PR equalization signal changes with the data row in the second embodiment respectively.
Figure 15B:
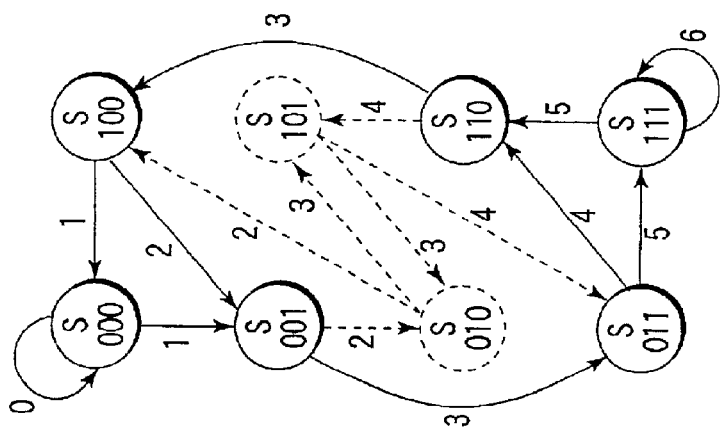
Figure 15A:
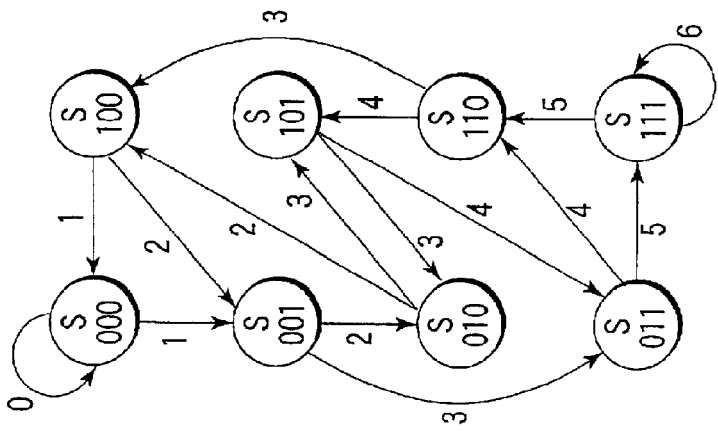

FIGS. 15A through 15C are state transition diagrams for explaining how the amplitude value of the PR (1, 2, 2, 1) equalization signal changes with the data row.

FIGS. 15A through 15C are diagrams showing the cases in which the d constraint is 0, 1 and 2 respectively. The d constraint refers to a restriction such that the restriction at the modulation signal is one and a certain number of 0's must be inserted between 1 and 1 in the code after the modulation. That is, in the case of d=0 (d constraint equal to zero), such pattern as

111001101001 may be allowed in which 1's continue after the RLL code shown in FIG. 3A.

However, in the case of d=1, the continuation of 1 is not allowed.

Therefore, at least one 0 must be inserted between 1 and 1 as can be seen in the case of

1010001010100.

Furthermore, in the case of d=2, two or more 0's are inserted between 1 and 1 as can be seen in

100100010010.

In a state transition diagrams shown in FIGS. 15A through 15C, Sxxx surrounded by a round represents a state by three continuous bit stream of write-data. As shown in FIG. 3C, the bit row of write-data refers to write current which is represented in a discrete time at which the RLL code row is converted into a NRZI form. In the case of d=0, the bit stream of write-data can be changed into an arbitrary value of 0 and 1. Both 010 and 011 can be assumed as a next state of, for example, a row of 001.

RLL code bit stream of write-data

| 001111 | 001010 |
| 001011 | 001101 |

In the case of d=0, since at least one 0 is inserted between 1 and 1 of the RLL code, for example, only 011 can be assumed next to the bit stream of write-data of 001.

RLL code bit stream of write-data

| 00101001 | 00110001 |
| 00100101 | 00111001 |

In the state of d=2, since at least two 0's are inserted between 1 and 1 of the RLL code, only the state of 111 can be assumed, for example, next to the state of 011.

RLL code bit stream of write-data

| 001001001 | 001110001 |
| 001001000 | 001110000 |

Figure 16A:
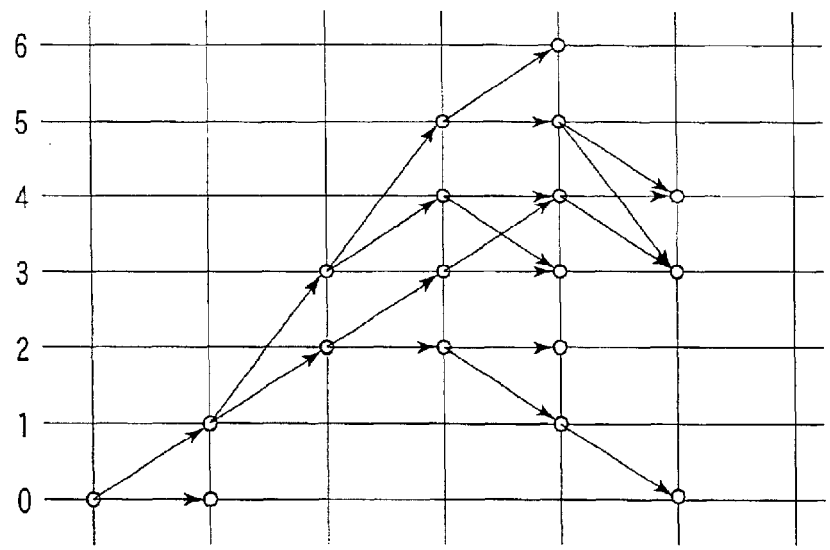
FIGS. 16A and 16B are views shown for explaining an amplitude pattern which is obtained at the rise of the waveform in the case of d=0, 1, 2 in the second embodiment respectively.
Figure 16B:
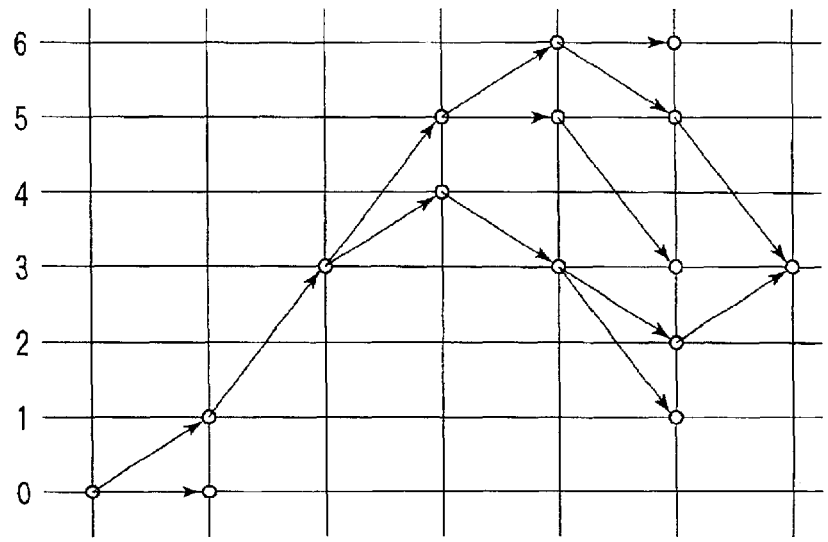
Figure 17:
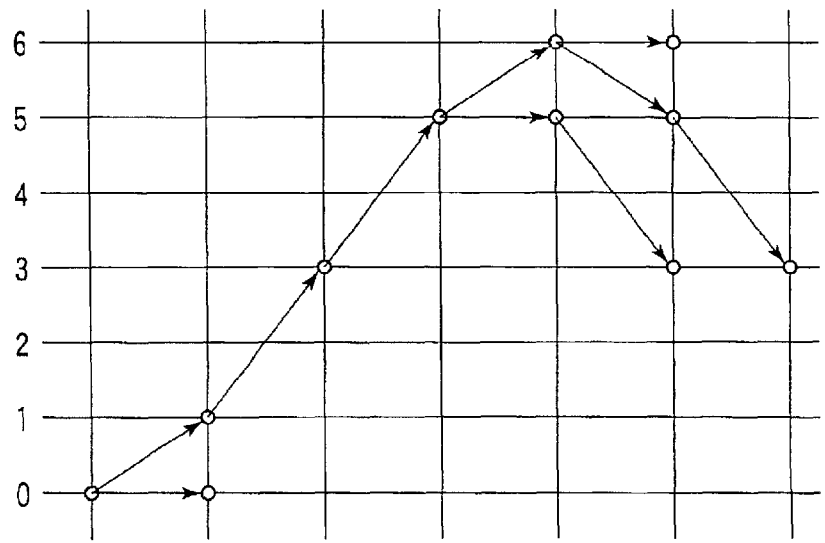
FIG. 17 is a view for explaining an amplitude pattern which can be taken at the rise of the waveform in the case of d=0, 1, 2 in the second embodiment.

In the state transition diagrams of FIGS. 15A through 15C, numerals attached in front of the arrows denote amplitude values when the state changes. Here, the amplitude values can assume values from 0 through 6. FIGS. 16A and 16B and FIG. 17 show an amplitude pattern which can be assumed at the rise of the waveform in the case of d=0, d=1 and d=2 on the basis of the state transition diagrams.

In order to determine a phase error from the PR equalization reference value (an ideal value) and an actual amplitude value, it is necessary to accurately know which value the reference value at that time can assume. However, if it is possible to accurately know the value at that time, a detector at the following step is not required. At this time, permitting that the prediction value becomes somewhat inaccurate, there is no other way than the adoption of a method which enables avoiding an error as much as possible. Furthermore, it is not necessary to take an error signal from all the sample points. Detection sensitivity may only be gained which enables the correction of a slow phase shift.

In consideration of the above situation, in the above first and the second embodiment, the phase error information is extracted only from the portion where the gradient of the waveform amplitude is large. A stable clock timing recovery can be realized by improving the detection precision of the timing phase gradient by not detecting the phase error at a portion with a small change in the amplitude which facilitates an error in judgment of values with noises.

Figure 18:
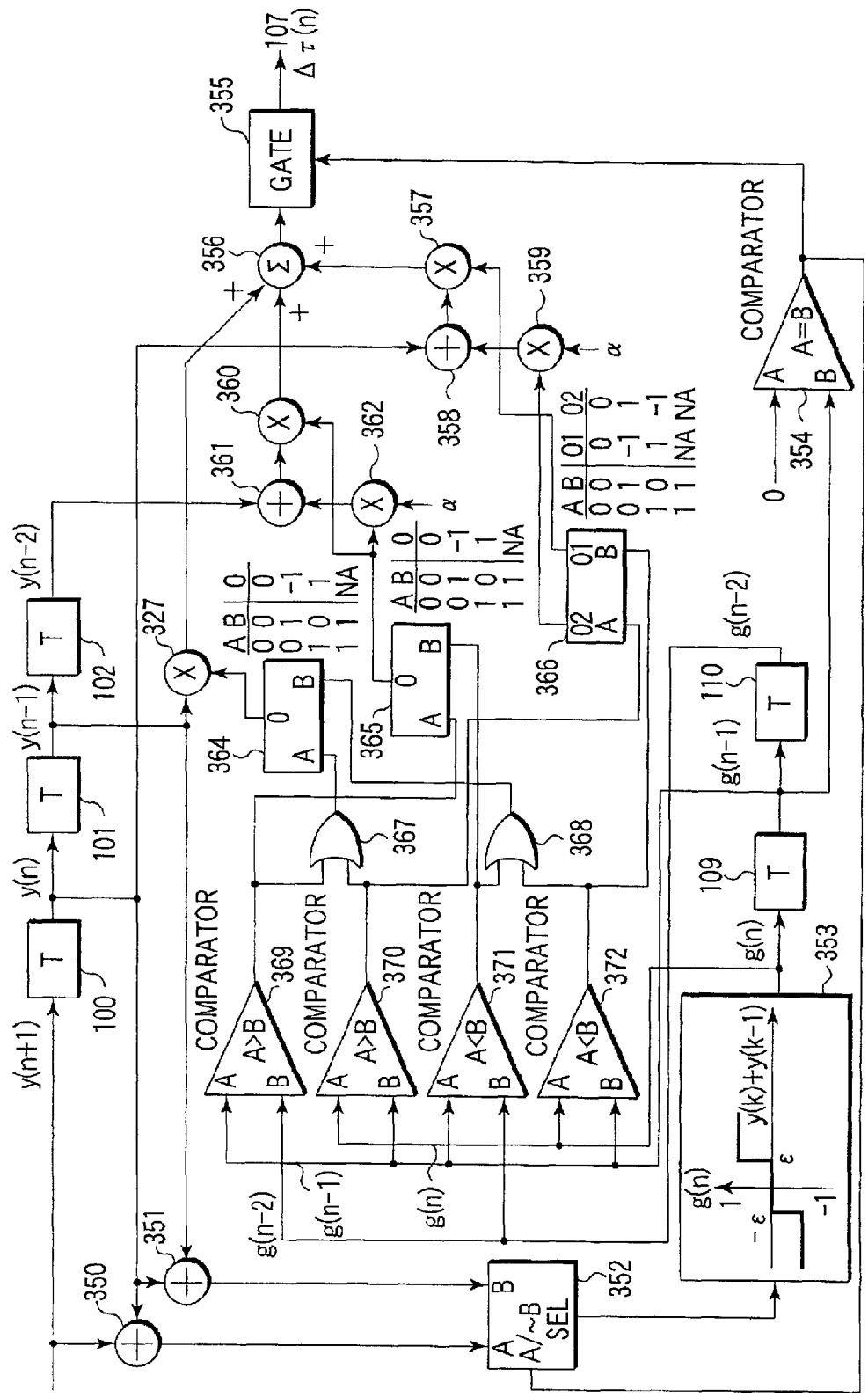
FIG. 18 is a block structure diagram shown for explaining the details of the timing phase gradient detection circuit, the view showing a third embodiment of the present invention.

FIG. 18 is a view showing a timing phase gradient detection circuit 18 corresponding to a random data waveform, the view showing a third embodiment of the present invention. In this case, in the PR class, the row is (1, 2, 2, 1) and the d constraint is set to 1 or more. Furthermore, in the following explanation, the amplitude value can again assume a value of −3 through +3.

In the same manner as FIG. 6, reference numerals 100 through 102 denote a delay circuit for outputting the input sample value with a delay of one sampling period. In the case where the input of the delay circuit 100 is y(n), the output of each of the delay circuits 100 through 102 becomes y(n−1), y(n−2) and y(n−3).

Furthermore, reference numerals 109 and 110 also denote a delay circuit for outputting the input sample value with a delay of one sampling period in the same manner. In the case where the input of the delay circuit 109 is g(n), the output of each of the delay circuits 109 and 110 become g(n−1) and g(n−2).

Here, g(n) denotes a value showing which of the reference values +2 or more, +1, 0, −1, −2 or less after the PR equalization the level of the amplitude value y(n) of the play back signal which is sampled in the nth sampling period should be regarded as. It is supposed that when the amplitude value y(n) should be regarded as +2 or more, g(n) is +1. When the amplitude value y(n) should be regarded as +1, 0 and +1, g(n) is 0. When the amplitude value y(n) should be regarded as −2 or less, g(n) is −1. For the sake of convenience, this g(n) is referred to as the judgment level hereinafter.

In this third embodiment, an examination is made as to whether the amplitude judgment value before and after the sampling time of the judgment level is a judgment value of −1 or +1 at which an amplitude gradient becomes large. In the case where the condition is met, the mathematical expression of the timing phase gradient is changed over in accordance with the condition to calculate the value. More specifically, in the case where a combination of g(n), g(n−1) and g(n−2) is

| (−1 0 0) | (+1 0 0) |
| (−1 0 +1) | (+1 0 −1) |
| (0 0 +1) | (0 0 −1), | the mathematical expression of the timing phase gradient is changed over in accordance with the condition to calculate the value.

Reference numeral 353 denotes a threshold value judging circuit for judging the value which should be assumed from an output value of a selection circuit 352. The selection circuit 352 selects y(n+1)+y(n) which is an output of the addition circuit 350 in the case where the value of g(n−1) is 0. In the case where the value of g(n−1) is other than 0, the selection circuit 352 selects y(n)+y(n−1) which is an output of the addition circuit 351.

FIGS. 19A through 19F are views showing a state of the transition of the waveform in the case where the value of g(n−1) is other than 0. In the case of FIGS. 19A and 19B, both y(n−1) and y(n) are −2 or less at g(n−1)=−1. In the case of FIG. 19C, y(n−1) and y(n) are 0 and −2 respectively at g(n−1)=−1. For example, in the case where −ϵ=−2.5 is set at the threshold value judging circuit 353, it can be judged that the judgment level is −1 in the case of FIGS. 19A and 19B and the judgment level is 0 in the case of FIG. 19C. In the same manner, at the fall of the waveform in the same manner, it is supposed that the judgment level is +1 in the case of FIGS. 19D and 19E and the judgment level can be set to 0 in the case of FIG. 19F.

Figure 20A:
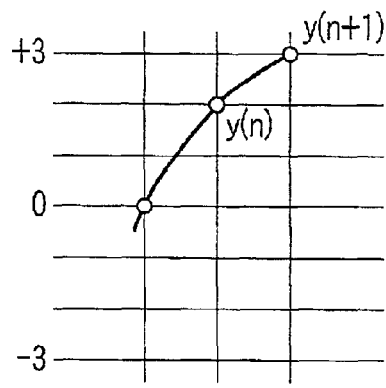
FIGS. 20A through 20F are views for explaining the state of transition of the waveform in the case where g(n−1) is 0 in the third embodiment respectively.
Figure 20B:
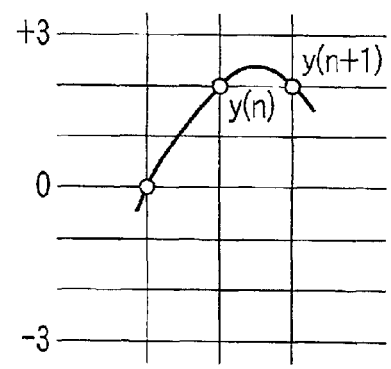
Figure 20C:
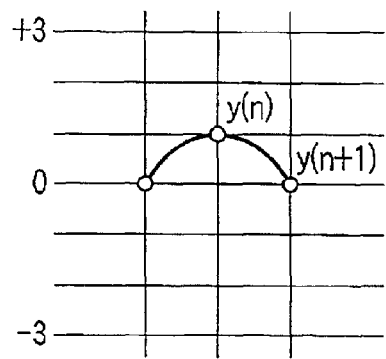
Figure 20D:
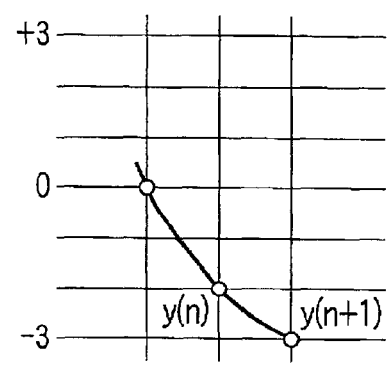
Figure 20E:
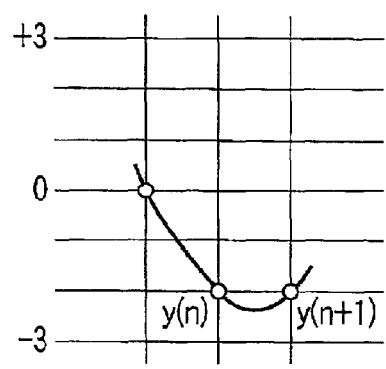
Figure 20F:
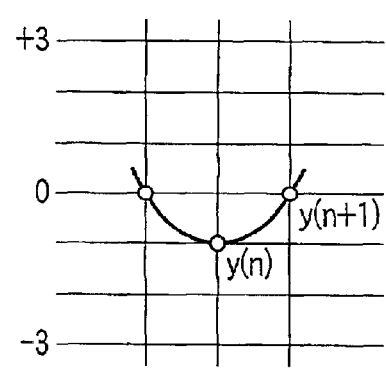

FIGS. 20A through 20F are views showing the state of the transition of the waveform in the case where the value of g(n−1) is 0. In the case of FIGS. 20A and 20B, since both y(n) and y(n+1) are +1, +2 or more at g(n−1)=0. In the case of FIG. 20C, y(n) and y(n+1) are +1 and 0 respectively at g(n−1)=0. For example, in the case where ϵ=2.5 is set at the threshold value judging circuit 353, it can be judged that the judgment level is +1 in the case of FIGS. 20A and 20B and the judgment level is 0 in the case of FIG. 20C. In the same manner, at the fall of the waveform, it can be judged that the judgment level is set to −1 in the case of FIGS. 20D and 20E and the judgment level is set to 0 in the case of FIG. 20F.

The timing phase gradient $\Delta\tau$ 107 in the phase error outputs the result of the addition of the output of the multiplication circuits 363, 360 and 357 with the addition circuit 356 only in the case in which g(n−1) is 0. The multiplication circuit 363 outputs the product of y(n−1) and an output of the constant determining circuit 364. The multiplication circuit 360 outputs the product of the output of the constant determining circuit 365 and the output of the addition circuit 361. The addition circuit 361 outputs the sum of y(n−2) and the result of the multiplication of the output of the constant determining circuit 365 and the constant $\alpha$ with the multiplication circuit 362. The multiplication circuit 357 outputs the product of the output of the constant determining circuit 366 and the output of the addition circuit 358. The addition circuit 358 outputs the sum of y(n) and the result of the multiplication of the output of the constant determining circuit 366 and the constant $\alpha$ with the multiplication circuit 359.

The operation will be more specifically explained by using FIGS. 21A through FIGS. 21F. Since g(n)=0, g(n−1)=0 and g(n−2)=−1 are set in the case of FIG. 21A, the output of the comparator 369 is 1, the output of the comparator 370 is 0, and the output of the comparator 371 is 0, and the output of the comparator 372 becomes 0. The timing phase gradient is determined from the following equation.

$$y(n-1)+[y(n-2)+1\times\alpha]\times 1$$

Now, suppose that the actual sample value 204 is such that the amplitude value is $+\gamma$ because of the phase error $\tau 2$ with respect to the amplitude value 203 in the case where the constant $\alpha=2$ is set, and the phase of y(n−1) matches. Furthermore, suppose that the actual sample value 202 is such that the amplitude value is $-2+\beta$ because of the phase error $\tau 1$ with respect to the amplitude value 201 in the case where the phase of y(n−2) matches.

$$+\gamma+(-2+\beta+2)=+\gamma+\beta \text{ is provided.}$$

A shift from the PR equalization reference value, namely the sum of $\gamma$ and $\beta$ is output as the timing phase gradient.

Since g(n)=+1, g(n−1)=0, and g(n−2)=−1 are set in the case of FIG. 21B, the output from the comparator 369 is 1, the output of the comparator 370 is 1, the output of the comparator 371 is 0, and the output of the comparator 372 is 0. The timing phase gradient is determined from $$y(n-1)+[y(n-2)+1\times\alpha]\times 1+[y(n)+(-1)\times\alpha]\times 1.$$

Now, suppose that the actual sample value 204 is such that the amplitude value is $+\gamma$ because of the phase error $\tau 2$ with respect to the amplitude value 203 in the case where the constant $\alpha=2$ is set, and the phase of y(n−1) matches. Furthermore, suppose that the actual sample value 202 is such that the amplitude value is $-2+\beta$ because of the phase error $\tau 1$ with respect to the amplitude value 201 in the case where the phase of y(n−2) matches. Furthermore, suppose that the actual sample value 206 is such that the amplitude value is $+2+\delta$ because of the phase error $\tau 3$ with respect to the amplitude value 205 in the case where the phase of y(n) matches. Thus, the following equation is given.

$$+\gamma+(-2+\beta+2)+(+2+\delta-2)=+\gamma+\beta+\delta.$$

A shift from the PR equalization reference value, namely, the sum of $\gamma$, $\beta$ and $\delta$ is output as the timing phase gradient.

Since g(n)=+1, g(n−1)=0, and g(n−2)=0 are set in the case of FIG. 21C, the output of the comparator 369 is 0, the output of the comparator 370 is 1, and the output of the comparator 371 is 0, and the output of the comparator 372 is 0. The timing phase gradient is determined from $$y(n-1)+[y(n)+(-1)\times\alpha]\times 1.$$

Now, suppose that the actual sample value 204 is such that the amplitude value is $+\gamma$ because of the phase error $\tau 2$ with respect to the amplitude value 203 in the case where the constant $\alpha=2$ is set, and the phase of y(n−1) matches. Furthermore, suppose that the actual sample value 206 is such that the amplitude value is $+2+\delta$ because of the phase error $\tau 3$ with respect to the amplitude value 205 in the case where the phase of y(n) matches. The following equation is given.

$$+\gamma+(+2+\delta-2)=+\gamma+\delta.$$

A shift from the PR equalization reference value, namely, the sum of $\gamma$ and $\delta$ is output as the timing phase gradient.

Since g(n)=0, g(n−1)=0, g(n−2)=+1 in the case of FIG. 21D, the output of the comparator 369 is 0, the output of the comparator 370 is 0, the output of the comparator 371 is 1, and the output of the comparator 372 is 0. Thus, the timing phase gradient is determined from the following equation.

$$y(n-b\ 1)\times(-1)+[y(n-2)+(-1)\times\alpha]\times(-1).$$

Now, suppose that the actual sample value 204 is such that the amplitude value is $-\gamma$ because of the phase error $\tau 2$ with respect to the amplitude value 203 in the case where the constant $\alpha=2$ is set, and the phase of y(n−1) matches. Besides, suppose that the actual sample value 202 is such that the amplitude value is $+2-\beta$ because of the phase error $\tau 1$ with respect to the amplitude value 201 in the case where the phase of y(n−2) matches. The following result is given.

$$-\gamma\times(-1)+(+2-\beta-2)\times(-1)=+\gamma+\beta.$$

A shift from the PR equalization reference value, namely, the sum of $\gamma$ and $\beta$ is output as the timing phase gradient.

Since g(n)=−1, g(n−1)=0, and g(n−2)=+1 are given in the case of FIG. 21E, the output of the comparator 369 is 0, the output of the comparator 370 is 0 and the output of the comparator 371 is 1, and the output of the comparator 372 is 1, and the timing phase gradient is determined from $$y(n-1)\times(-1)+[y(n-2)+(-1)\times\alpha]\times(-1)+[y(n)+(+1)\times\alpha]\times(-1).$$

Now, suppose that the actual sample value 204 is such that the amplitude value is −γ because of the phase error τ2 with respect to the amplitude value 203 in the case where the constant α=2 is set, and the phase of y(n−1) matches. Furthermore, suppose that the actual sample value 202 is such that the amplitude value is +2−β because of the phase error τ1 with respect to the actual value 201 in the case where the phase of y(n−2) matches. Furthermore, suppose that the actual sample value 206 is such that the amplitude value is −2−δ because of the phase error τ3 with respect to the amplitude value 205 in the case where the phase of y(n) matches. The following equation will be given.

$$-\gamma\times(-1)+(+2-\beta-2)+(-2-\delta+2)\times(-1)=+\gamma+\beta+\delta$$

A shift from the PR equalization reference value, namely, the sum of γ, β and δ is output as the timing phase gradient.

Since g(n)=−1, g(n−1) 0, and g(n−2)=0 are set in the case of FIG. 21F, the output pf the comparator 369 is 0, the output of the comparator 370 is 0, and the output of the comparator 371 is 0 and the output of the comparator 372 is 1, and the timing phase gradient is determined from $$y(n-1)\times(-1)+[y(n)+(+1)\times\alpha]\times(-1).$$

Now, suppose that the actual sample value 204 is such that the amplitude value is −γ because of the phase error τ2 with respect to the amplitude 203 in the case where the constant α=2 is set, and the phase of y(n−1) matches. Furthermore, suppose that the actual sample value 206 is such that the amplitude value is −2−δ because of the phase error τ3 with respect to the amplitude value 205 in the case where the phase of y(n) matches. The following result is given.

$$-\gamma\times(-1)+(-2-\delta+2)\times(-1)=+\gamma+\delta.$$

A shift from the PR equalization reference value, namely, the sum of γ and δ is output as the timing phase gradient.

Figure 22:
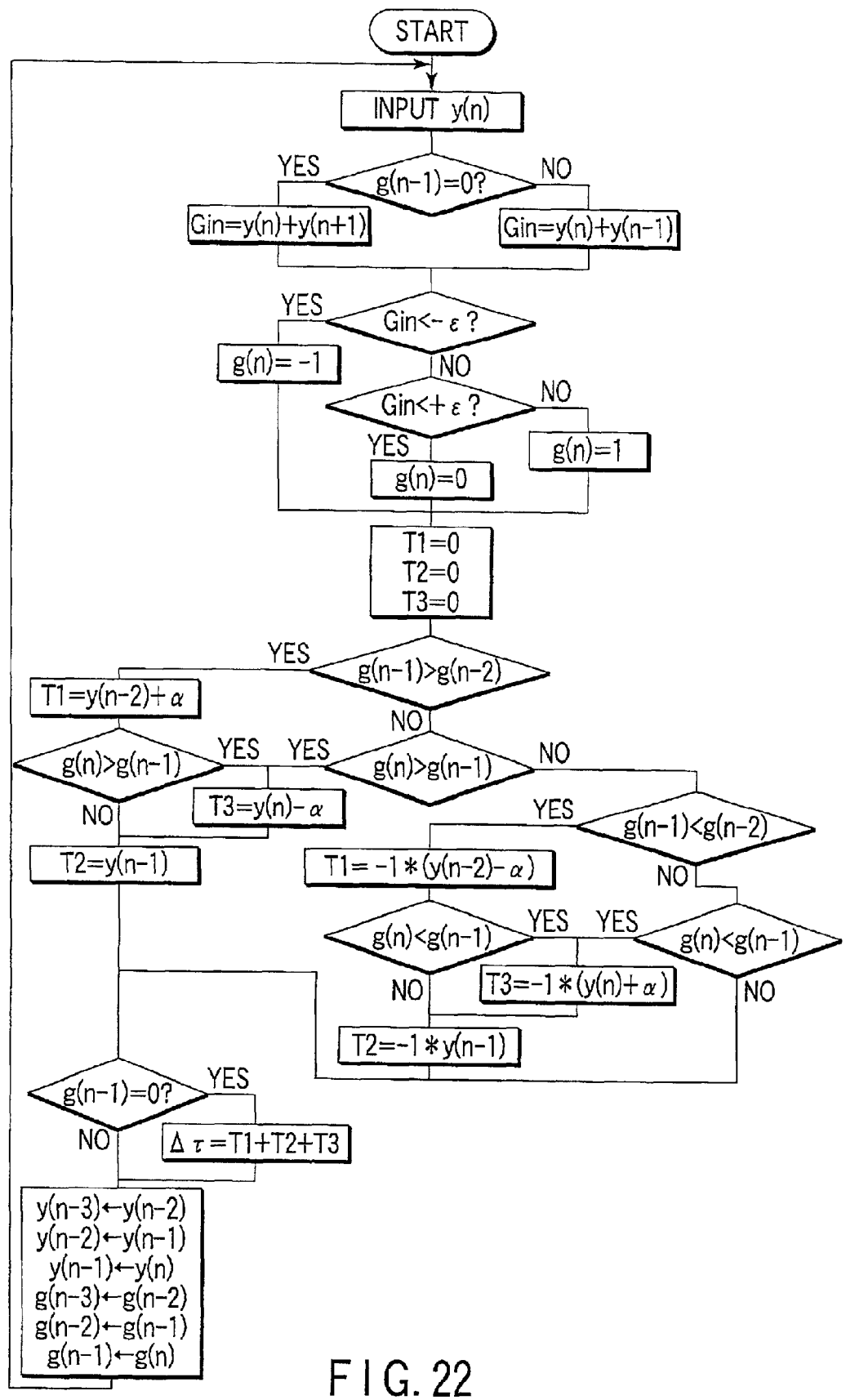
FIG. 22 is a flowchart for explaining in summary the operation of detecting the timing phase gradient in the third embodiment.

FIG. 22 is a flowchart showing in summary an operation in the third embodiment.

In the case where the data stream is at random, there are many cases in which the data stream to be written is at random, the amplitude value at each of the sample points of the play back waveform is such that the phase error cannot be detected in the absence of change as compared with the sample value before and after the sample value, the detection is difficult under the influence of the noise because of few change, or the detection precision is inferior.

In the third embodiment, an examination is made as to whether the amplitude judgment value before and after the sampling time on the judgment level 0 is either the judgment value of −1 or +1 at which the amplitude gradient becomes large. When the condition is met, the mathematical expression on the timing phase gradient is changed over in accordance with the condition to calculate the value. That is, since the sample point is identified at which the change in the amplitude is on the level 2 of the reference value after the PR equalization, and the timing phase gradient is calculated only at the sample point at which the influence of the noise is small by the selection of the calculation method of the timing phase gradient on the basis of the judgment value of the past and the present sample point, the detection precision/quality is improved in the following explanation.

FIG. 23 shows the timing phase gradient detection circuit 18 corresponding to the random data system waveform, the view showing a fourth embodiment of the present invention. Similarly to FIG. 18, PR class is (1, 2, 2, 1) and d constraint is 1 or more. Further, in the following explanation, the amplitude value is a value from −3 to +3.

In the example of the previous FIG. 18, the constant α is used for canceling the PR equalization reference value for determining the timing phase gradient on the judgment level of −1 and +1. It is ideal that this constant α can be actively adjust this constant α in accordance with the signal level. In the case where the constant α is set as a fixed value, the timing phase gradient circuit becomes weak with respect to the amplitude change. In the fourth embodiment shown in FIG. 23, the amplitude value on the reference level is canceled without using the constant by determining the timing phase gradient using both the judgment level of +1 and −1, so that the timing phase gradient circuit is influenced by the amplitude change with difficulty.

In FIG. 23, reference numerals 100 through 102 denote a delay circuit for outputting the input sample value with a delay in one sample period. In the case where the input of the delay circuit 100 is y(n), the output of each of the delay circuits 100 through 102 becomes y(n−1), y(n−2) and y(n−3).

Besides, reference numerals 109 and 110 denote a delay circuits for outputting the input sample value with a delay in one sample period. In the case where the input of the delay circuit 109 is g(n), the output of each of the delay circuits 109 through 110 becomes g(n−1) and g(n−2).

Here, g(n) is a value showing which of the reference values +2 or more, +1, 0, −1, and −2 or less after the PR equalization the level of the amplitude value y(n) of the play back signal which is sampled in the nth sampling period should be regarded as. When the amplitude value should be regarded as +2 or more, g(n) is +1. When the amplitude value should be regarded as −1, 0, and +1, g(n) is 0. When the amplitude value should be regarded as −2 or less, g(n) is −1. This g(n) is referred to as a judgment level.

In this fourth embodiment, an examination is made as to whether the amplitude judgment value before and after the sampling point on the judgment level 0 is either the judgment value −1 or the judgment value +1 at which the amplitude gradient becomes large. In the case where the condition is met, the mathematical expression is changed over in accordance with the condition to calculate the value. More specifically, the combination of g(n), g(n−1), and g(n−2) is

| (−1 0 0) | (+1 0 0) |
| (−1 0 +1) | (+1 0 −1) |
| (0 0 +1) | (0 0 −1) | the mathematical expression of the timing phase gradient is changed over in accordance with the mathematical expression of the timing phase gradient to calculate the value.

Reference 353 denotes the threshold value judgment circuit for judging the value which g(n) should assume from the output value of the selection circuit 352. The selection circuit 352 selects y(n+1)+y(n) which is an output of the addition circuit 350 in the case where g(n−1) is 0. In the case where g(n−1) is other than 0, y(n)+y(n−1) is selected which is an output of the addition circuit 351. A method for determining the judgment level in accordance with the change in the waveform amplitude is the same as the third embodiment shown in FIG. 18 using FIGS. 19A through 19F and FIG. 20A through FIG. 20F.

The timing phase gradient $\Delta\tau$ 107 in the phase error is such that the addition circuit 380 outputs the addition result of the output of the multiplication circuits 363 and 381 only in the case where g(n−1) is 0. The multiplication circuit 363 outputs the product of y(n−1) and the output of the constant determining circuit 364. The multiplication circuit 381 outputs the product of the output of the constant determining circuit 383 and the output of the addition circuit 382. The addition circuit 382 outputs the sum of y(n) and y(n−2).

An operation will be explained more specifically by using FIGS. 24A through 24F. Since g(n)=0, g(n−1)=0, and g(n−2)=−1 are set in the case of FIG. 24A, the output of the comparator 369 is 1, the output of the comparator 370 is 0, the output of the comparator 371 is 0 and the output of the comparator 372 is 0. The timing phase gradient is determined from $$y(n-1)\times(+1)+[y(n)+y(n-2)]\times 0.$$

Suppose that an actual sample value 204 is such that the amplitude value is +γ because of the phase error τ2 with respect to the amplitude value 203 in the case where the phase of y(n−1) matches, the following result is given.

$$y(n-1)\times(+1)=+\gamma.$$

A shift γ from the PR equalization reference value is output as the timing phase gradient.

Figure 24A:
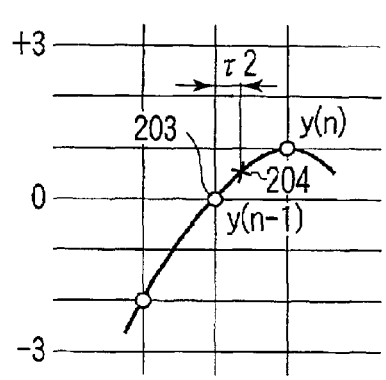
FIGS. 24A through 24F are views for specifically explaining the operation of detecting the timing phase gradient in the fourth embodiment respectively.
Figure 24B:
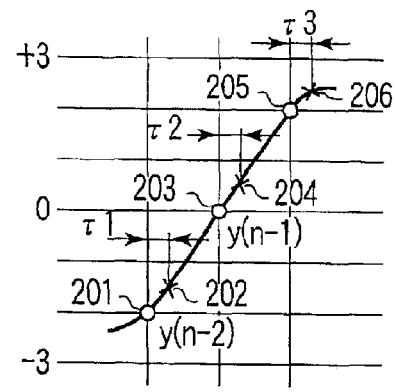

Since g(n)=+1, g(n−1)=0, and g(n−2)=−1 are set in the case of FIG. 24B, the output of the comparator 369 is 1, the output of the comparator 370 is 1, the output of the comparator 371 is 0, and the output of the comparator 372 is 0, and the timing phase gradient is determined from the following mathematical expression.

$$y(n-1)\times(+1)+[y(n)+y(n-2)]\times 1$$

Suppose that the actual sample value 204 is such that the amplitude value is +γ because of the phase error τ2 with respect to the amplitude value 203 in the case where the phase of y(n−1) matches. Furthermore, suppose that the actual sample value 202 is such that the amplitude value is −2+β because of the phase error τ1 with respect to the amplitude value 201 in the case where the phase of y(n−2) matches. Furthermore, suppose that the actual sample value 206 is such that the amplitude value is +2+δ because of the phase error τ3 with respect to the amplitude value 205 in the case where the phase of y(n) matches. The following result is given.

$$+\gamma+(+2+\delta)+(-2+\beta)=+\gamma+\beta+\delta.$$

A shift from the PR equalization reference value, namely, the sum of γ, β and δ is output as the timing phase gradient.

Figure 24C:
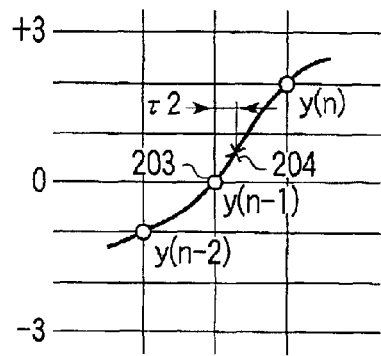
Figure 24D:
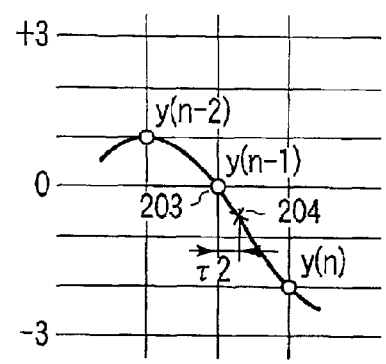

Since g(n)=+1, g(n−1)=0, and g(n−2)=0 is set in the case of FIG. 24C, the output of the comparator 369 is 0, the output of the comparator 370 is 1, the output of the comparator 371 is 0, and the output of the comparator 372 is 0. The timing phase gradient is determined from $$y(n-1)\times(+1)+[y(n)+y(n-2)]\times 0.$$

Suppose that the actual sample value 204 is such that when the amplitude value is +γ because of the phase error τ2 with respect to the amplitude value 203 in the case where the phase of y(n−1) matches, the following mathematical expression is given.

$$y(n-1)\times(+1)=+\gamma$$

A shift γ from the PR equalization reference value is output as the timing phase gradient.

Since g(n)=0, g(n−1)=0 and g(n−2)=+1 are set in the case of 24D, the output of the comparator 369 is 0, the output of the comparator 370 is 0, the output of the comparator 371 is 1, and the output of the comparator 372 is 0. The timing phase gradient is determined from $$y(n-1)\times(-1)+[y(n)+y(n-2)]\times 0.$$

Suppose that the actual sample value 204 is such that when the amplitude value is −γ because of the phase error τ2 with respect to the amplitude value 203 in the case where the phase of y(n−1) matches, the following mathematical expression is given.

$$y(n-1)\times(-1)=-\gamma\times(-1)=+\gamma$$

A shift γ from the PR equalization reference value is output as the timing phase gradient.

Figure 24E:
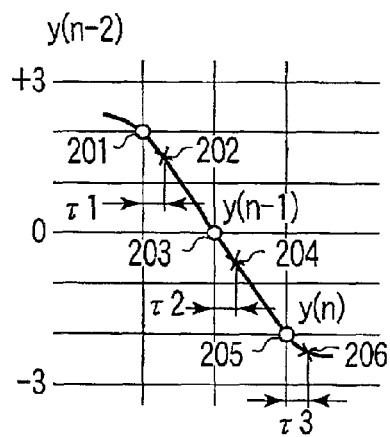

Since g(n)=−1, g(n−1)=0, and g(n−2)=+1 is set in the case of FIG. 24E, the output of the comparator 369 is 0, the output of the comparator 370 is 0, the output of the comparator 371 is 1 and the output of the comparator 372 is 1. The timing phase gradient is determined from $$y(n-1)\times(-1)+[y(n)+y(n-2)]\times(-1).$$

Suppose that the actual sample value 204 is such that the amplitude value is −γ because of the phase error τ2 with respect to the amplitude value 203 in the case where the phase of y(n−1) matches. Furthermore, suppose that the actual sample value 202 is such that the amplitude value is +2−β because of the phase error τ1 with respect to the amplitude value 201 in the case where the phase of y(n−2) matches. Furthermore, suppose that the actual sample value 206 is such that the amplitude value is −2−δ because of the phase error τ3 with respect to the amplitude value 205 in the case where the phase of y(n) matches, the following mathematical expression is given.

$$-\gamma\times(-1)+[(-2-\delta)+(+2-\beta)]\times(-1)=+\gamma+\beta+\delta.$$

A shift from the PR equalization reference value, namely, the sum of γ, β and δ is output as the timing phase gradient.

Figure 24F:
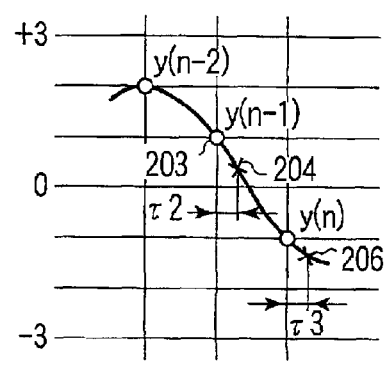

Since g(n)=−1, g(n−1)=0, and g(n−2)=0 is set in the case of FIG. 24F, the output of the comparator 369 is 0, the output of the comparator 370 is 0, the output of the comparator 371 is 0 and the output of the comparator 372 is 1. The timing phase gradient is determined from $$y(n-1)\times(-1)+[y(n)+y(n-2)]\times 0.$$

With respect to the amplitude value 203 in the case where the phase of y(n−1) matches, the actual sample value 204 is such that the amplitude value is −γ because of the phase error τ2, the following mathematical expression is given.

$$y(n-1)\times(-1)=-\gamma\times(-1)=+\gamma$$

A shift γ from the PR equalization reference value is output as the timing phase gradient.

Figure 25:
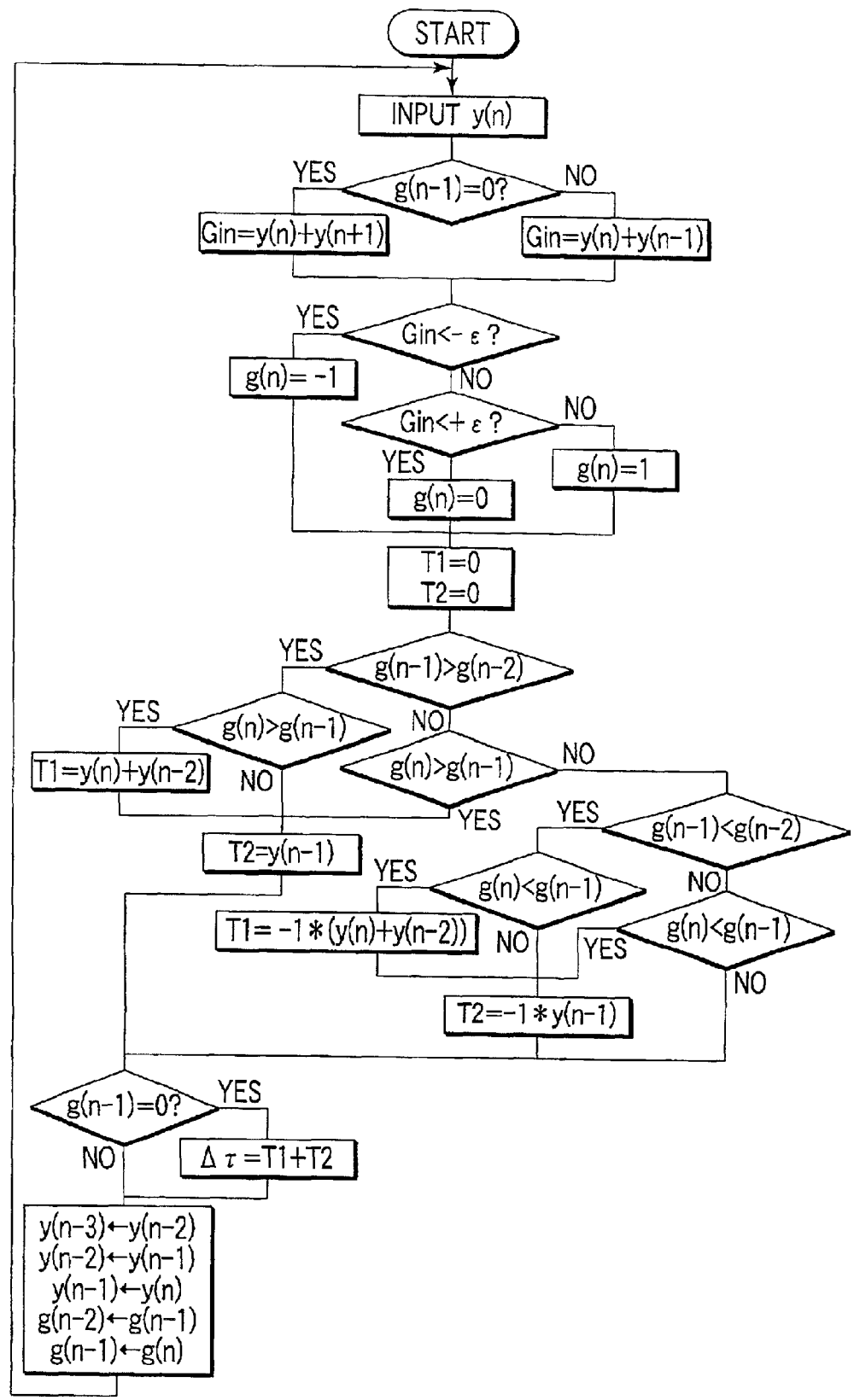
FIG. 25 is a flowchart for explaining in summary the operation of detecting the timing phase gradient in the fourth embodiment.

FIG. 25 is a flowchart showing in summary an operation in the fourth embodiment.

In the fourth embodiment, a point is selected at which the amplitude value of the play back waveform is changed by two levels on the PR reference level from the minus amplitude to the plus amplitude with respect to the central location of amplitude with two logical AND circuits 384 and 385 at two continuous sample points. In the representation with the judgment value of the previous g(n), a point is selected at which a combination of g(n), g(n−1) and g(n−2) is a point of (−1 0+1) and (+1 0−1).

In this manner, when the timing phase gradient is determined by selecting a portion where the change amount of amplitude is particularly large from the waveform corresponding to the random signal stream, the change amount of amplitude by the phase shift becomes large, so that the influence of the noise can be decreased while easily cancelling the reference value after the PR equalization for measuring the shift with the amplitude value in the plus direction and the amplitude value in the minus direction with the result that the influence of the shift from the PR reference value by the amplitude change can be exerted with greater difficulty.

A portion where the amplitude value of the play back waveform largely changes from the minus amplitude to the plus amplitude at the continuous sample point with respect to the central location of amplitude is obtained in the case where pits or a mark on the recording medium is read which is formed with the writing current pattern in which continuous 0's for at least (a partial response class interference length−1) channel clock portion and continuous 1's for at least (a partial response class interference length −1) channel clock portion are located adjacent to each other.

Specifically, since the interference length is 4 in the case of the PR class (1, 2, 2, 1), the play back waveform shown in FIG. 3E and FIG. 3F will be as follows when the writing current waveform as shown in FIG. 3C is "000111".

```
     0001221
 +    1221
 +     1221
     ─────────
     000135531
```

A large change appears in the PR equalization level 1>level 3>level 5 and in the play back waveform amplitude.

In the same manner, since the interference length is 3 in the case of PR (1, 2, 1) class, when the writing current waveform shown in FIG. 3C is "0011", the following result is obtained.

```
     00121
 +    121
 +     121
     ─────────
     0013431
```

Thus, a large change appears in the PR equalization level 1>level 3. Since the PR equalization level assumes only five values from 0 to 4 in the PR (1, 2, 1) class, the change of level 1>level 3 becomes a maximum change that can appear.

In the above explanation, there has been explained a rise edge in which the sequence of 1 continues after the sequence of 0. However, the same thing holds true of the fall edge in which the sequence of 0 continues after the sequence of 1.

Figure 26:
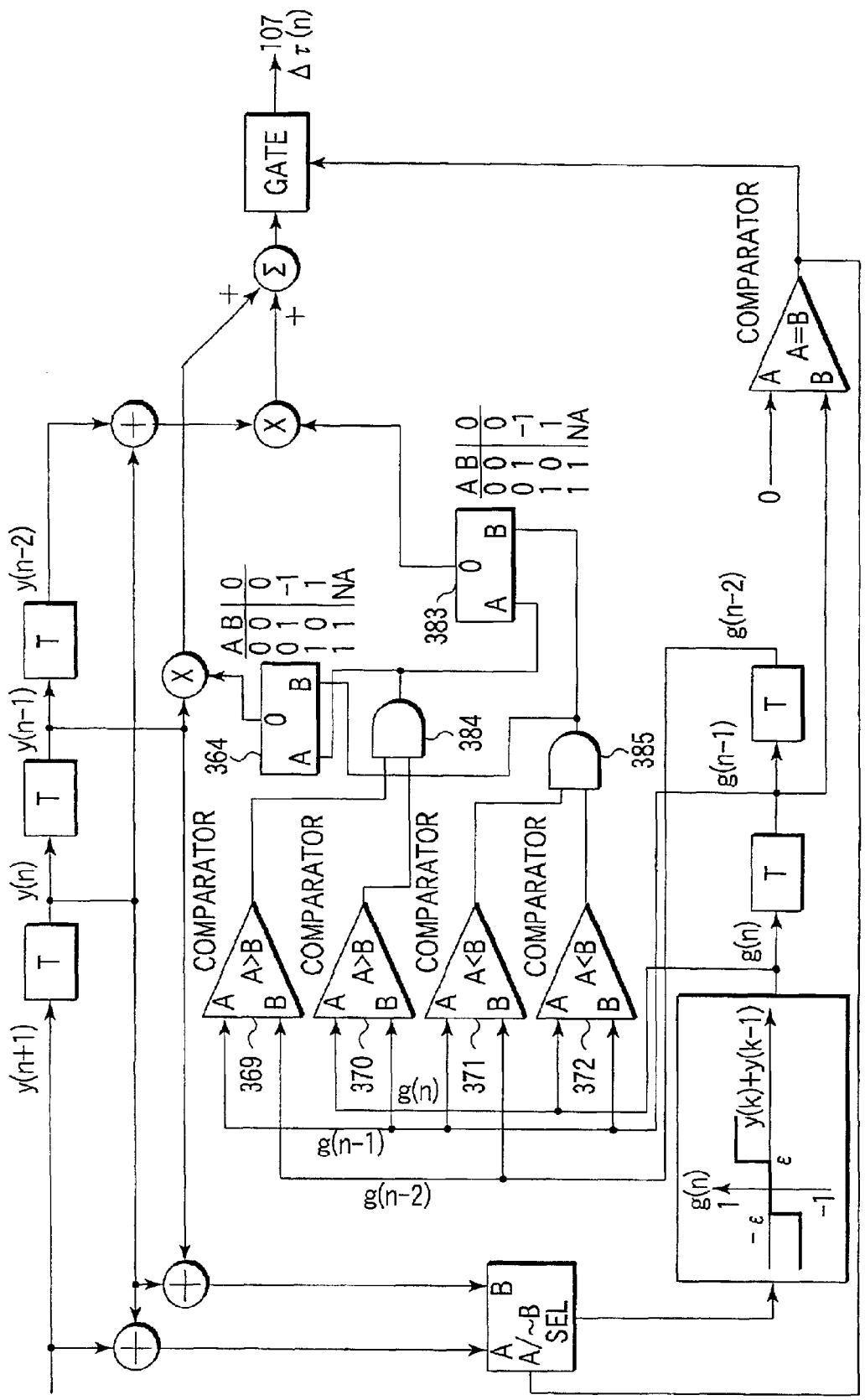
FIG. 26 is a block structure diagram shown for explaining the details of the phase error detection circuit, the view showing a fifth embodiment of the present invention.

FIG. 26 is a view showing a timing phase gradient detection circuit 18 corresponding to the random data waveform, the view showing the fifth embodiment of the present invention. In the same manner as FIG. 18, the PR class is (1, 2, 2, 1) and the d constraint is 1 or more. Furthermore, in the following explanation, it is supposed that the amplitude value assumes a value from −3 to +3.

A difference from the example in FIG. 23 described above is that the input A of the constant determining circuit 364 becomes a logical AND of the output of the comparators 369 and 370 instead of a logical OR thereof. In the same manner, the input B is the logical AND of the output of the comparator 371 and the comparator 372 instead of the logical OR thereof.

With this change, in the amplitude pattern of FIG. 24A, FIG. 24C, FIG. 24D, and FIG. 24F, the timing phase gradient is not detected, and the timing phase gradient is detected only in the case of the patterns in FIGS. 24B and 24E.

That is, only the point is selected in which the combination of g(n), g(n−1) and g(n−2) is (−1 0+1) and (+1 0−1). The timing phase gradient is detected only in the case where a portion where the amplitude value of the play back waveform largely changes from the minus amplitude to the plus amplitude at the continuous sample point with respect to the central location of amplitude is obtained in the case where pits or a mark on the recording medium is read which is formed with the writing current pattern in which continuous 0's for at least (a partial response class interference length-1) channel clock portion and continuous 1's for at least (a partial response class interference length-1) channel clock portion are located adjacent to each other.

Figure 27:
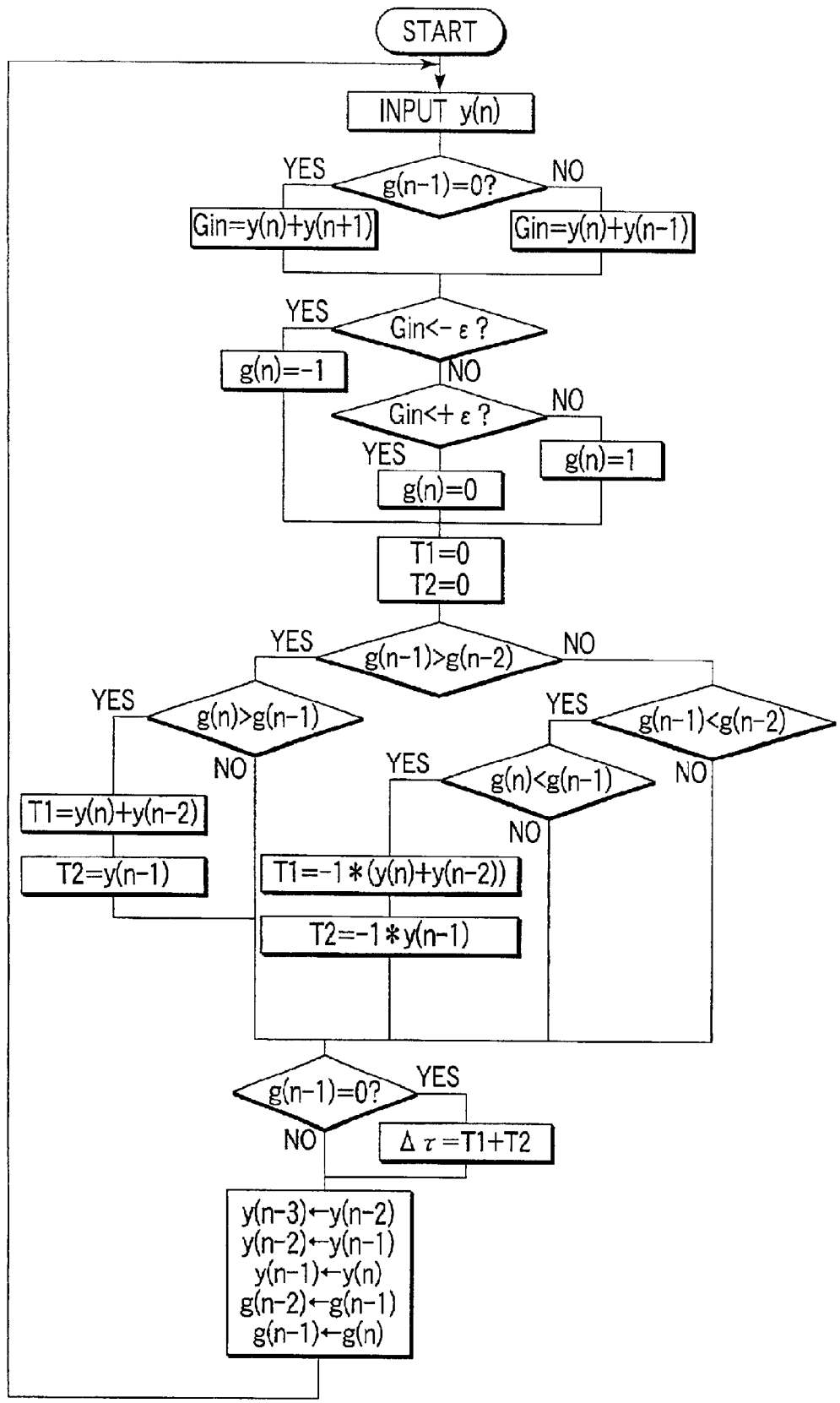
FIG. 27 is a flowchart for explaining in summary the operation of detecting the timing phase gradient in the fifth embodiment.

FIG. 27 is a flowchart showing in summary an operation according to the fifth embodiment.

According to the present invention as described in detail, even in the PR class in which the amplitude levels after equalization becomes 5 through 7, the timing phase gradient can be detected from the amplitude which is sampled at the discrete time with the result that the PLL can be driven with an output from the PR equalizer of the data detection system without providing a different circuit for the timing recovery.

Consequently, in the storage apparatus for recording in a high density in which the waveform interference largely appears, a synchronized clock is stably supplied to data even when the PR class is used which has a larger interference amount with the result that the data detection error rate can be suppressed to a low level and a storage apparatus can be provided which can obtain a high reliability at a large capacity.

Furthermore, according to means for detecting a timing phase gradient according to the present invention, the current sample value and the value before one sample time are used in the judgment of the direction of change of the amplitude with the result that the effect of removing the influence of noise is large by averaging so that the timing phase gradient can be accurately calculated.

Furthermore, according to means for detecting the timing phase gradient, the timing phase gradient can be efficiently detected because the method for calculating the timing phase gradient is changed over on the basis of the assumed amplitude level and the history of the assumed amplitude level.

Furthermore, according to the means for detecting the timing phase gradient according to the present invention, since the timing phase gradient is determined by selecting a portion where a change amount of amplitude is particularly large which is obtained in the case where pits or a mark on the recording medium is read which is formed with the writing current pattern in which continuous 0's for at least (a partial response class interference length-1) channel clock portion and continuous 1's for at least (a partial response class interference length-1) channel clock portion are located adjacent to each other. Consequently the change amount of amplitude by the phase shift becomes large and the influence of noise can be decreased while the reference value after the PR equalization for measuring the shift can be easily canceled with the amplitude value in the plus direction and the amplitude value in the minus direction. Thus, the influence by the shift from the PR reference value by the change of amplitude can be exerted up with greater difficulty.

In the above explanation, there has been explained on the PR (1, 2, 2, 1) class in which when d constraint is either 0 or 1 and the PR equalization level becomes 7 values of 0 through 6. In the PR (1, 2, 2, 1), as described above, the values of 2 and 4 in the PR equalization cannot be assumed in the case where the d constraint is 2, so that the value of 5 can be assumed except for the amplitude margin and the fine setting of the threshold value.

In each of the embodiments of the present invention, the amplitude values of −1 and +1 are not used in the calculation of the timing phase gradient because the level 3 constitutes the center on level 2 and level 4 on which the change of the amplitude value is small. Consequently, the method of the present invention can be also easily applied to the PR class having the value of 5 in correspondence to the case of PR (1, 2, 2, 1) when the d constraint is 2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A digital data play back apparatus comprising:
   conversion means for converting a signal read from a recording medium into digital data by sampling the signal in a clock frequency output from a variable frequency oscillation means;
   equalizing means for equalizing digital data output from this conversion means into a waveform which agrees with a partial response class on the basis of a clock output from a variable frequency oscillation means;
   data detection means for detecting data on the basis of a clock output from the variable frequency oscillation means with respect to the signal waveform output from this equalizing means;
   timing phase gradient detection means for detecting a timing phase gradient between a signal waveform output from the equalization means and a clock output from the variable frequency oscillation means; and
   control means for controlling the oscillation frequency of the variable frequency oscillation means on the basis of the timing phase gradient detected with the timing phase gradient detection means.

2. The data play back apparatus according to claim 1, wherein the timing phase gradient detection means comprises:
   addition means for adding an amplitude value of the signal waveform output from the equalizing means at two sample points which continues in time;
   prediction means for predicting the amplitude value in the case where the signal waveform output from the equalizing means is phase synchronized with the clock output from the variable frequency oscillation means on the basis of the addition result obtained with this addition means; and
   detection means for detecting the timing phase gradient on the basis of the amplitude value predicted with the prediction means and the signal waveform output from the equalizing means.

3. The data play back apparatus according to claim 1, wherein the timing phase gradient detection means comprises:
   addition means for adding an amplitude value of the signal waveform output from the equalizing means at two sample points which continues in time;
   prediction means for predicting the direction of change of the amplitude in the case where the signal waveform output from the equalizing means is phase synchronized with the clock output from the variable frequency oscillation means on the basis of the addition result obtained with this addition means; and
   detection means for detecting the timing phase gradient on the basis of the direction of change in the amplitude value predicted with the prediction means and the signal waveform output from the equalizing means.

4. The digital data play back apparatus according to claim 1, wherein the timing phase gradient detection means comprises:
   prediction means for predicting an amplitude value in the case where the signal waveform output from the equalizing means is phase synchronized with a clock generated from the variable frequency oscillation means;
   recording means for recording the history of the amplitude value predicted with the prediction means;
   calculation means for calculating the timing phase gradient in a plurality of sample points of the signal waveform output from the equalizing means on the basis of the amplitude value predicted with the prediction means and the history of the amplitude value recorded on the recording means; and
   selection means for selecting an output of the calculation means on the basis of the amplitude value predicted with the prediction means and the history of the amplitude value recorded on the recording means.

5. The digital data play back apparatus according to claim 1, wherein the timing phase gradient detection means comprises:
   judgment means for judging which of the plurality of the reference values of the waveform after equalization the level of the amplitude of the signal output from the equalizing means belongs to;
   recording means for recording the history of the judgment result of the judgment means;
   calculation means for calculating the timing phase gradient at the plurality of sample points of the signal waveform output from the equalizing means on the basis of the judgment result of the judgment means and the history of the amplitude recorded on the recording means; and
   selection means for selecting an output of the calculation means on the basis of the judgment result of the judgment means and the history of the amplitude value recorded on the recording means.

6. The digital data play back apparatus according to claim 1, wherein the timing phase gradient detection means comprises:
   prediction means for predicting the amplitude value in the case where the signal waveform output from the equalizing means is phase synchronized with the clock output from the variable frequency oscillation means;
   recording means for recording the history of the amplitude value predicted with the prediction means;

judgment control means for judging that a plurality of sample point rows of the signal waveform output from the equalizing means on the basis of the amplitude value predicted with the prediction means and the history of the amplitude value recorded on the recording means are sample point rows in the case where a pit or a mark on a recording medium is read, wherein a continuous first value for at least (a partial response class interference length-1) clock portion and a second value for at least (a partial response class interference length-1) clock portion are formed with adjacent writing current pattern; and calculation means for calculating a timing phase gradient from a plurality of sample times of the signal waveform output from the equalizing means on the basis of the amplitude value predicted with the prediction means and the history of the amplitude value recorded with the recording means in accordance with the judgment result with the judgment control means.

7. The digital data play back apparatus according to claim 1, wherein the timing phase gradient detection means comprises:

judgment means for judging which of the plurality of reference values of the waveform after equalization the level of the amplitude value of the signal output from the equalizing means belongs to;

recording means for recording the history of the judgment result of the judgment means; and judgment control means for judging that a plurality of sample points of the signal waveform output from the equalizing means on the basis of the judgment result of the judgment means and the history of the amplitude value recorded with the recording means are sample points in the case where a pit or a mark on a recording medium is read, wherein a continuous first value for at least (a partial response class interference length-1) clock portion and a second value for at least (a partial response class interference length-1) clock portion are formed with adjacent writing current pattern; and calculation means for calculating a timing phase gradient from a plurality of sample times of the signal waveform output from the equalizing means on the basis of the judgment result of the judgment means and the history of the amplitude value recorded with the recording means in accordance with the judgment result with the judgment control means.

8. A method for playing back digital data comprising:

a first step of converting a signal read from the recording medium into digital data by sampling the signal in a clock frequency output from a variable frequency oscillation means;

a second step of equalizing the digital data output at the first step into a waveform which agrees with a partial response class on the basis of a clock output from the variable frequency oscillation means;

a third step of detecting data on the basis of the clock output from the variable frequency oscillation means with respect to the signal waveform output at the second step a fourth step of detecting a timing phase gradient between a signal waveform output at the second step and a clock output from the variable frequency oscillation means; and a fifth step of controlling the oscillation frequency of the variable frequency oscillation means on the basis of the timing phase gradient detected at the fourth step.

9. The digital data play back method according to claim 8, wherein the fourth step comprises:

an addition step of adding an amplitude value of the signal waveform output at the second step at two sample points which continues in time;

a prediction step of predicting an amplitude value in the case where the signal waveform output at the second step is phase synchronized with the clock output from the variable frequency oscillation means on the basis of the addition result obtain at the addition step; and a detection step of detecting the timing phase gradient on the basis of the amplitude value predicted with this prediction step and the signal waveform output at the second step.

10. The digital data play back method according to claim 8, wherein the fourth step comprises:

an addition step of adding an amplitude value of the signal waveform output at the second step at two sample points which continues in time;

a prediction step of predicting a direction of change in the amplitude value in the case where the signal waveform output at the second step is phase synchronized with the clock output from the variable frequency oscillation means on the basis of the addition result obtained at the addition step; and a detection step of detecting a timing phase gradient on the basis of the direction of change in the amplitude value predicted with this prediction step and the signal waveform output at the second step.

11. The digital data play back method according to claim 8, wherein the fourth step comprises:

a prediction step of predicting an amplitude value in the case where the signal waveform output at the second step is phase synchronized with the clock output from the variable frequency oscillation means;

a recording step of recording the history of the amplitude value predicted at the prediction step;

a calculation step of calculating the timing phase gradient at the plurality of sample points of the signal waveform output at the second step on the basis of the amplitude value predicted at the prediction step and the history of the amplitude value recorded at the recording step; and a selection step of selecting an output of the calculation step on the basis of the amplitude value predicted at the prediction step and the history of the amplitude value recorded at the recording step.

12. The digital data play back method according to claim 8, wherein the fourth step comprises:

a judgment step of judging which of the plurality of the reference values of the waveform after equalization the level of amplitude value of the signal output at the second step belongs to;

a recording step of recording the history of the judgment result at this judgment step;

a calculation step of calculating the timing phase gradient at the plurality of sample points of the signal waveform output at the second step on the basis of the judgment result at the judgment step and the history of the amplitude value recorded at the recording step; and a selection step of selecting an output of the calculation step on the basis of the judgment result of the judgment step and the history of the amplitude value recorded at the recording step.

13. The digital data play back method according to claim 8, wherein the fourth step comprises:

a prediction step of predicting the amplitude value in the case where the signal waveform output at the second step is phase synchronized with the clock output from the variable frequency oscillation means;

a recording step of recording the history of the amplitude value predicted at this prediction step;

a judgment control step of judging that a plurality of sample point rows of the signal waveform output at the second step on the basis of the amplitude value predicted at the prediction step and the history of the amplitude value recorded at the recording step are a sample point row in the case where a pit or a mark on a recording medium is read, wherein a continuous first value for at least (a partial response class interference length-1) clock portion and a second value for at least (a partial response class interference length-1) clock portion are formed with adjacent writing current pattern; and a calculation step of calculating the timing phase gradient from a plurality of sample times of the signal waveform output from the second step on the basis of the amplitude value predicted at the prediction step and the history of the amplitude value recorded at the recording step in accordance with the judgment result at the judgment control step.

14. The digital data play back method according to claim 8, wherein the fourth step comprises:

a judgment step of judging which of the plurality of the reference values of the waveform after equalization the level of the amplitude value of the signal output at the second step belongs to;

a recording step for recording the history of the judgment result at the judgment step;

a judgment control step for judging that a plurality of sample point rows of the signal waveform output at the second step on the basis of the judgment result at the judgment step and the history of the amplitude value recorded at the recording step are a sample point row in the case where a pit or a mark on a recording medium is read, wherein a continuous first value for at least (a partial response class interference length-1) clock portion and a second value for at least (a partial response class interference length-1) clock portion are formed with adjacent writing current pattern; and a calculation step of calculating the timing phase gradient from a plurality of sample times of the signal waveform output at the second step on the basis of the judgment result at the judgment step and the history of the amplitude value recorded at the recording step in accordance with the judgment result at the judgment control step.

* * * * *